United States Patent
Nohara et al.

(10) Patent No.: US 10,737,943 B2
(45) Date of Patent: Aug. 11, 2020

(54) SINGLE-CRYSTAL DIAMOND, METHOD FOR MANUFACTURING SINGLE-CRYSTAL DIAMOND, AND CHEMICAL VAPOR DEPOSITION DEVICE USED IN SAME

(71) Applicants: Sumitomo Electric Industries, Ltd., Osaka-shi (JP); SUMITOMO ELECTRIC HARDMETAL CORP., Itami-shi (JP)

(72) Inventors: Takuya Nohara, Itami (JP); Natsuo Tatsumi, Itami (JP); Yoshiki Nishibayashi, Itami (JP); Hitoshi Sumiya, Itami (JP); Yutaka Kobayashi, Itami (JP); Akihiko Ueda, Itami (JP)

(73) Assignees: Sumitomo Electric Industries, Ltd., Osaka-shi (JP); Sumitomo Electric Hardmetal Corp., Itami-shi (JP)

( * ) Notice: Subject to any disclaimer, the term of this patent is extended or adjusted under 35 U.S.C. 154(b) by 0 days.

(21) Appl. No.: 16/071,564

(22) PCT Filed: Jan. 18, 2017

(86) PCT No.: PCT/JP2017/001578
§ 371 (c)(1),
(2) Date: Jul. 20, 2018

(87) PCT Pub. No.: WO2017/126561
PCT Pub. Date: Jul. 27, 2017

(65) Prior Publication Data
US 2019/0031515 A1    Jan. 31, 2019

(30) Foreign Application Priority Data

Jan. 22, 2016    (JP) .................. 2016-010560

(51) Int. Cl.
*C01B 32/26* (2017.01)
*C23C 16/01* (2006.01)
(Continued)

(52) U.S. Cl.
CPC .............. *C01B 32/26* (2017.08); *A44C 27/00* (2013.01); *C23C 16/01* (2013.01);
(Continued)

(58) Field of Classification Search
None
See application file for complete search history.

(56) References Cited

U.S. PATENT DOCUMENTS

2008/0311023 A1*  12/2008  Yamamoto ............ C30B 25/105
                                                        423/446
2014/0004319 A1    1/2014  Dhillon et al.
2017/0314159 A1*  11/2017  Nishibayashi .......... C01B 32/26

FOREIGN PATENT DOCUMENTS

CN    103354845 A    10/2013
DE    19826681 A1    12/1999
(Continued)

*Primary Examiner* — Guinever S Gregorio
(74) *Attorney, Agent, or Firm* — Baker Botts L.L.P.; Michael A. Sartori

(57) ABSTRACT

Provided is a method for manufacturing a single-crystal diamond, the method including the steps of: forming a protective film on at least a part of a surface of an auxiliary plate; preparing a diamond seed crystal substrate; disposing an auxiliary plate with a protective film that has the protective film formed on the auxiliary plate, and a diamond seed crystal substrate in a chamber; and growing a single-crystal diamond on a principal surface of the diamond seed crystal substrate by a chemical vapor deposition method while introducing a carbon-containing gas into the chamber.

10 Claims, 7 Drawing Sheets

(51) Int. Cl.

| | | |
|---|---|---|
| *C30B 25/08* | (2006.01) | |
| *C30B 25/20* | (2006.01) | |
| *C30B 29/04* | (2006.01) | |
| *H01L 21/205* | (2006.01) | |
| *A44C 27/00* | (2006.01) | |
| *C30B 25/12* | (2006.01) | |
| *C23C 16/02* | (2006.01) | |
| *C23C 16/27* | (2006.01) | |
| *C23C 16/458* | (2006.01) | |
| *C30B 25/18* | (2006.01) | |

(52) U.S. Cl.
CPC .......... *C23C 16/0236* (2013.01); *C23C 16/27* (2013.01); *C23C 16/274* (2013.01); *C23C 16/277* (2013.01); *C23C 16/4581* (2013.01); *C30B 25/08* (2013.01); *C30B 25/12* (2013.01); *C30B 25/186* (2013.01); *C30B 25/20* (2013.01); *C30B 25/205* (2013.01); *C30B 29/04* (2013.01); *H01L 21/205* (2013.01)

(56) References Cited

FOREIGN PATENT DOCUMENTS

| | | |
|---|---|---|
| EP | 2360289 A1 | 8/2011 |
| EP | 2705179 A1 | 3/2014 |
| EP | 3173510 A1 | 5/2017 |
| JP | 09-111461 A | 4/1997 |
| JP | 2004-503461 A | 2/2004 |
| JP | 2009-132948 A | 6/2009 |
| JP | 2012-131707 A | 7/2012 |
| WO | 01/096634 A1 | 12/2001 |
| WO | 2015071484 A1 | 5/2015 |

* cited by examiner

SINGLE-CRYSTAL DIAMOND, METHOD FOR MANUFACTURING SINGLE-CRYSTAL DIAMOND, AND CHEMICAL VAPOR DEPOSITION DEVICE USED IN SAME

TECHNICAL FIELD

The present invention relates to a single-crystal diamond, a method for manufacturing a single-crystal diamond, and a chemical vapor deposition device used in the method. The present application claims priority based on Japanese Patent Application No. 2016-010560 filed on Jan. 22, 2016. The disclosure of the Japanese patent application is incorporated herein by reference in its entirety.

BACKGROUND ART

Diamonds have excellent characteristics such as high light transmissivity, high thermal conductivity, high carrier mobility, high dielectric breakdown electric field and low inductive loss, and are widely used for cutting tools and abrasion-proof tools particularly because of its unusually high hardness. Heretofore, a natural single-crystal diamond or a single-crystal diamond synthesized by a high-temperature and high-pressure method has been widely used, but in recent years, it has been possible to synthesize a thick and self-standing single-crystal diamond even by a chemical vapor deposition method, and application of such a single-crystal diamond in various fields as described above has been expected.

Studies have been extensively conducted on improvement of quality of a CVD (chemical vapor deposition) single-crystal diamond as described above. For example, in Proceedings of Japan Society of Applied Physics Academic Meeting in Spring, 2004, page 635 (NPD 1), a distribution of defects such as dislocations is observed by X-ray topography of a homoepitaxial diamond obtained by a CVD (chemical vapor deposition) method. In addition, National Patent Publication No. 2004-503461 (PTD 1) discloses a method in which the density of defects on a surface of a diamond base as a seed substrate is reduced, and a diamond is then synthesized by a CVD method for obtaining a CVD single-crystal diamond having light transmissivity and excellent electronic physical properties with regard to a high-quality CVD single-crystal diamond layer having a thickness greater than 2 mm, and a method for production thereof.

CITATION LIST

Patent Document

PTD 1: National Patent Publication No. 2004-503461

Non Patent Document

NPD 1: Proceedings of Japan Society of Applied Physics Academic Meeting in Spring, 2004, page 635

SUMMARY OF INVENTION

A method for manufacturing a single-crystal diamond according to one aspect of the present invention includes the steps of: forming a protective film on at least a part of a surface of an auxiliary plate; preparing a diamond seed crystal substrate; disposing an auxiliary plate with a protective film that has the protective film formed on the auxiliary plate, and the diamond seed crystal substrate in a chamber; and growing a single-crystal diamond on a principal surface of the diamond seed crystal substrate by a chemical vapor deposition method while introducing a carbon-containing gas into the chamber.

A single-crystal diamond according to one aspect of the present invention contains nitrogen as an impurity element in an amount of less than 500 ppb.

A single-crystal diamond according to one aspect of the present invention contains silicon as an impurity element in an amount of less than 1000 ppb.

A single-crystal diamond according to one aspect of the present invention contains impurity elements other than nitrogen and silicon in an amount of less than 500 ppb.

A chemical vapor deposition device according to one aspect of the present invention is a chemical vapor deposition device to be used in the method for manufacturing a single-crystal diamond according to the above-mentioned aspect, the device including the chamber, and the auxiliary plate with the protective film, the auxiliary plate with the protective film being disposed in the chamber and having the protective film formed on at least a part of a surface of the auxiliary plate.

DETAILED DESCRIPTION

Figure 1:
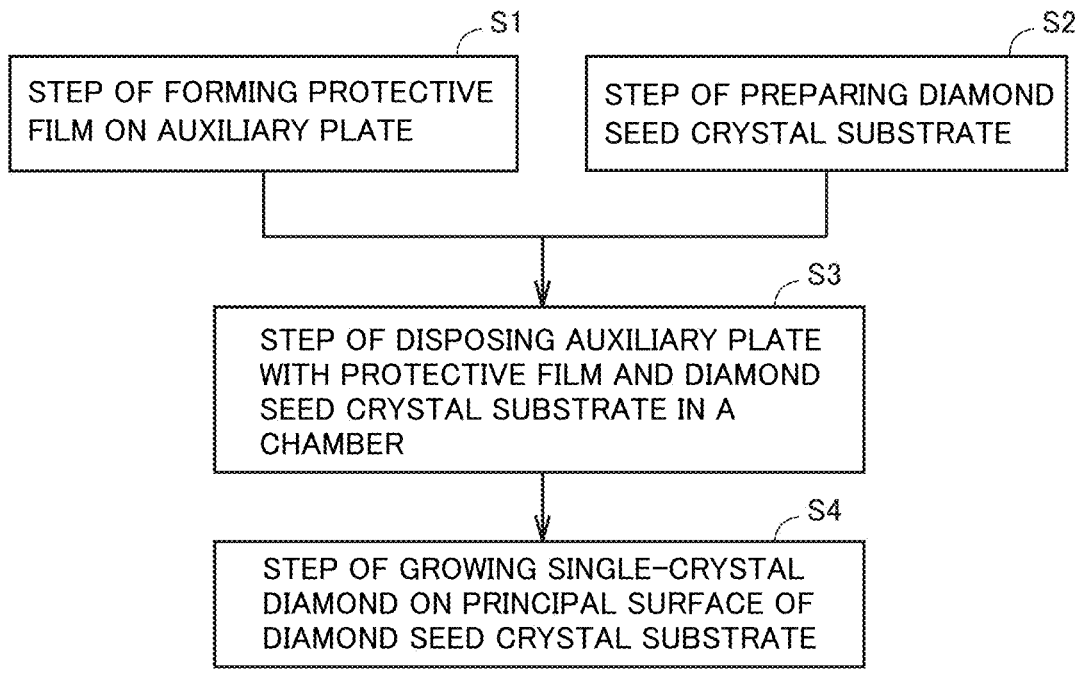
FIG. 1 is a flow chart showing steps in a method for manufacturing a single-crystal diamond according to one aspect of the present invention.

Problem to be Solved by Present Disclosure

When a CVD single-crystal diamond as disclosed in, for example, Proceedings of Japan Society of Applied Physics Academic Meeting in Spring, 2004, page 635 (NPD 1) and National Patent Publication No. 2004-503461 (PTD 1) is used for an optical component, an electronic component, a semiconductor material or the like, there is the problem that very small chippings and cracks are generated at a dicing cross-section in laser-cutting or dicing of a semiconductor material, an electronic component, a heat radiation material, an optical component, an ornamental material or the like, and may cause breakage and a major chipping afterwards, and thus a substrate area cannot be effectively secured. In addition, there is the problem that the light transmissivity of the CVD single-crystal diamond is not high enough to use the CVD single-crystal diamond for an optical component.

In addition, when a single-crystal diamond grown by a CVD method (hereinafter, also referred to as a CVD single-crystal diamond) as disclosed in, for example, Proceedings of Japan Society of Applied Physics Academic Meeting in Spring, 2004, page 635 (NPD 1) and National Patent Publication No. 2004-503461 (PTD 1) is used for a cutting tool, a abrasion-proof tool or the like, there is the problem that the cutting tool, abrasion-proof or the like has a short lifetime because such a CVD single-crystal diamond has lower chipping resistance, and is more easily chipped as compared to a natural single-crystal diamond, and a single-crystal diamond grown by a high-temperature and high-pressure method (hereinafter, also referred to as a high-temperature and high-pressure single-crystal diamond). In addition, there is the problem that impurity elements in the CVD single-crystal diamond are mixed in a cut material and/or a polished material.

Thus, an object of the present disclosure is to solve the above-mentioned problems and to provide a single-crystal diamond which is suitably used for semiconductor materials (diodes, transistors and the like), electronic components (resistive parts, capacitive parts and the like), heat dissipation materials (heat sinks), optical components (window materials, lenses and the like), ornament materials, cutting tools, polishing tools and the like and which has a high purity, high light transmissivity and excellent chipping resistance, a method for manufacturing a single-crystal diamond, and a chemical vapor deposition device used in the method.

Advantageous Effect of the Present Disclosure

According to the present disclosure, it is possible to provide a single-crystal diamond having a high purity, high light transmissivity and excellent chipping resistance, a method for manufacturing a single-crystal diamond, and a chemical vapor deposition device used in the method.

Accordingly, it is possible to provide a single-crystal diamond which is suitably used for semiconductor materials (diodes, transistors and the like), electronic components (resistive parts, capacitive parts and the like), heat dissipation materials (heat sinks), optical components (window materials, lenses and the like), ornament materials, cutting tools, polishing tools and the like, a method for manufacturing a single-crystal diamond, and a chemical vapor deposition device used in the method.

DESCRIPTION OF EMBODIMENTS

First, embodiments of the present invention will be listed and described.

A method for manufacturing a single-crystal diamond according to one embodiment of the present invention includes the steps of: forming a protective film on at least a part of a surface of an auxiliary plate; preparing a diamond seed crystal substrate; disposing an auxiliary plate with a protective film that has the protective film formed on the auxiliary plate, and a diamond seed crystal substrate in a chamber; and growing a single-crystal diamond on a principal surface of the diamond seed crystal substrate by a chemical vapor deposition method while introducing a carbon-containing gas into the chamber. With the method for manufacturing a single-crystal diamond according to this embodiment, a single-crystal diamond having a low content of impurity elements, high light transmissivity and excellent chipping resistance can be obtained because the method includes the above-mentioned steps.

In the method for manufacturing a single-crystal diamond according to this embodiment, the auxiliary plate can be formed of an oxide. In the method for manufacturing a single-crystal diamond, the single-crystal diamond can be further stably and efficiently obtained because the auxiliary plate transmits a microwave, and is stable even under a reducing atmosphere.

In the method for manufacturing a single-crystal diamond according to this embodiment, the protective film may contain a metal element serving as a getter of an element other than carbon. In the method for manufacturing a single-crystal diamond, the getter adsorbs impurity elements in the chamber to prevent ingress of the impurity elements into the single-crystal diamond, and thus a single-crystal diamond having a further low content of impurity elements can be obtained.

In the method for manufacturing a single-crystal diamond according to this embodiment, the step of preparing a diamond seed crystal substrate may be a step of preparing a diamond seed crystal substrate having a seed crystal damage point on a principal surface. Alternatively, the step of preparing a diamond seed crystal substrate may be a step of preparing a diamond seed substrate in which groups of crystal defect points aggregate on a principal surface by a CVD method. In the method for manufacturing a single-crystal diamond, the single-crystal diamond can be obtained in which groups of crystal defect points that are tip points at which crystal defect lines reach a crystal growth principal surface aggregate. In the single-crystal diamond, stress is relaxed by a large number of crystal defect lines to suppress occurrence of large chipping, and chipping can be made hard to occur by regions where groups of crystal defect points aggregate. Therefore, the single-crystal diamond is suitably used for semiconductor materials (diodes, transistors and the like), electronic components (resistive parts, capacitive parts and the like), heat dissipation materials (heat sinks), optical components (window materials, lenses and the like), ornament materials, cutting tools, polishing tools and the like.

In the method for manufacturing a single-crystal diamond according to this embodiment, the step of preparing a diamond seed crystal substrate may be a step of preparing a diamond seed crystal substrate having on a principal surface a seed crystal defect linear aggregation region where groups of seed crystal defect points aggregate and extend linearly. In the method for manufacturing a single-crystal diamond, the single-crystal diamond can be obtained in which a plurality of crystal defect linear aggregation regions, where groups of crystal defect points that are tip points at which crystal defect lines reach a crystal growth principal surface aggregate and extend linearly in a direction at an angle less than or equal to 30° with respect to one arbitrarily specified direction, are present in parallel. In the single-crystal diamond, stress is relaxed by a large number of crystal defect lines to suppress occurrence of large chipping, and a direction in which chipping hardly occurs can be controlled by a plurality of crystal defect linear aggregation regions which are present in parallel, and extend linearly in a direction at an angle less than or equal to 30° with respect to one arbitrarily specified direction. Therefore, the single-crystal diamond is suitably used for semiconductor materials (diodes, transistors and the like), electronic components (resistive parts, capacitive parts and the like), heat dissipation materials (heat sinks), optical components (window materials, lenses and the like), ornament materials, cutting tools, polishing tools and the like.

In the method for manufacturing a single-crystal diamond according to this embodiment, two or more seed crystal defect linear aggregation regions may be present per 1 mm in a direction perpendicular to a direction in which the seed crystal defect linear aggregation regions extend linearly, and the distance between the seed crystal defect linear aggregation regions may be less than or equal to 500 μm in the direction in which the regions extend linearly. Here, the direction in which the seed crystal defect linear aggregation region extends linearly refers to the specified one direction which is an average direction in a plurality of directions in which a plurality of seed crystal defect linear aggregation regions extend respectively. In the method for manufacturing a single-crystal diamond, two or more seed crystal defect linear aggregation regions are present per 1 mm in a direction perpendicular to a direction in which the seed crystal defect linear aggregation regions extend linearly, and the distance between the seed crystal defect linear aggregation regions is less than or equal to 500 μm in the direction in which the regions extend linearly. Thus, a single-crystal diamond in which two or more seed crystal defect linear aggregation regions are present per 1 mm in a direction perpendicular to a direction in which the crystal defect linear aggregation regions extend linearly, and the distance between the crystal defect linear aggregation regions is less than or equal to 500 μm in the direction in which the regions extend linearly can be obtained by a chemical vapor deposition method. Therefore, the single-crystal diamond can be obtained in which stress is relaxed by a large number of crystal defect lines to suppress occurrence of large chipping, and a direction in which chipping hardly occurs can be controlled by a plurality of dense crystal defect linear aggregation regions which are present in parallel, and extend linearly in a direction at an angle less than or equal to 30° with respect to one arbitrarily specified direction.

In the method for manufacturing a single-crystal diamond according to this embodiment, five or more long seed crystal defect linear aggregation regions having a length greater than or equal to 300 μm may be present per 1 cm$^2$ of the principal surface. In the method for manufacturing a single-crystal diamond, occurrence of large chipping in a single-crystal diamond to be grown is suppressed, and the strength of the single-crystal diamond as a whole is increased because five or more long seed crystal defect linear aggregation regions having a length greater than or equal to 300 μm are present per 1 cm$^2$ of the principal surface. From such a viewpoint, twenty or more longer seed crystal defect linear aggregation regions having a length greater than or equal to 500 μm may be present per 1 cm$^2$ of the principal surface.

In the method for manufacturing a single-crystal diamond according to this embodiment, the density of seed crystal defect points may be greater than 10 mm$^{-2}$. In the method for manufacturing a single-crystal diamond, the density of seed crystal defect points is greater than 10 mm$^{-2}$, and thus a single-crystal diamond in which the density of crystal defect points that are tip points at which the crystal defect lines reach the crystal growth principal surface is greater than 20 mm$^{-2}$ can be obtained by a chemical vapor deposition method. Therefore, a single-crystal diamond can be obtained in which stress is relaxed by dense crystal defect lines to suppress occurrence of large chipping. Further, in the method for manufacturing a single-crystal diamond according to this embodiment, the density of seed crystal defect points may be greater than 100 mm$^{-2}$. In the method for manufacturing a single-crystal diamond, the density of seed crystal defect points is greater than 100 mm$^{-2}$, and thus a single-crystal diamond in which the density of crystal defect points that are tip points at which the crystal defect lines reach the crystal growth principal surface is greater than 300 mm$^{-2}$ can be obtained by a chemical vapor deposition method. Therefore, a single-crystal diamond can be obtained in which stress is relaxed by dense crystal defect lines to further suppress occurrence of large chipping. Further, from the viewpoint of further suppressing large chipping in a single-crystal diamond, the density of seed crystal defect points may be greater than 1000 mm$^{-2}$, or greater than $1\times10^4$ mm$^{-2}$. However, when the density of seed crystal defect points is excessively high, seed crystal defect points are excessively close to one another, so that the stress increasing effect exceeds the stress relaxation effect, and therefore the density of seed crystal defect points may be preferably $1\times10^6$ mm$^{-2}$.

In the method for manufacturing a single-crystal diamond according to this embodiment, the density of complex dislocation points that are tip points at which complex dislocations obtained by combining a plurality of edge dislocations and/or a plurality of helical dislocations reach a crystal growth principal surface, among crystal defect points of a single-crystal diamond to be grown, may be greater than 20 mm$^{-2}$. In the single-crystal diamond, occurrence of large chipping is further suppressed because the density of complex dislocation points that are tip points at which complex dislocations reach a crystal growth principal surface is greater than 20 mm$^{-2}$, and the effect of relaxing stress by complex dislocations is high. From such a viewpoint, the density of complex dislocation points may be preferably greater than 30 mm$^{-2}$, more preferably greater than 300 cm$^{-2}$.

In the method for manufacturing a single-crystal diamond according to this embodiment, the density of seed crystal damage points indicating points at which crystal damage is present may be greater than 3 mm$^{-2}$ in a secondary electron image in an electron microscope after a principal surface of a diamond seed crystal substrate is hydrogen-terminated. In the method for manufacturing a single-crystal diamond, the density of seed crystal damage points that generate a large number of crystal defect lines particularly in a single-crystal diamond grown by a chemical vapor deposition method, among seed defect points, is greater than 3 mm$^{-2}$, and thus a single-crystal diamond having dense crystal defect lines can be obtained by a chemical vapor deposition method. Therefore, a single-crystal diamond can be obtained in which stress is relaxed by dense crystal defect lines to suppress large chipping.

With the method for manufacturing a single-crystal diamond according to this embodiment, a single-crystal diamond is manufactured which has a high light transmittance and in which groups of crystal defect points that are tip points at which crystal defect lines indicating lines having crystal defects in an X-ray topographic image for a crystal growth principal surface reach the crystal growth principal surface aggregate.

A single-crystal diamond according to one embodiment of the present invention contains nitrogen as an impurity element in an amount of less than 500 ppb. Since the single-crystal diamond contains nitrogen atoms as impurity element atoms only in an amount of less than 500 ppb, the single-crystal diamond has a high purity and high light transmittance, and has a low concentration of nitrogen atoms as heterogeneous element atoms that disturb extension of chipping in application of strong stress to a specific portion, and therefore large chipping over a long distance easily occurs, but since a large number of crystal defect lines themselves, and relaxation of stress by the crystal defect lines disturb extension of chipping, occurrence of large chipping is suppressed. Thus, the single-crystal diamond of this embodiment which contains nitrogen atoms as impurity element atoms in an amount of less than 500 ppb is suitably used for applications of semiconductor materials (diodes, transistors and the like), electronic components (resistive parts, capacitive parts and the like), heat dissipation materials (heat sinks), optical components (window materials, lenses and the like), ornament materials, cutting tools, polishing tools and the like. Further, for significantly exhibiting the above-mentioned effect, the single-crystal diamond of this embodiment may contain nitrogen atoms as impurity element atoms in an amount of less than 250 ppb, in an amount of less than 75 ppb, in an amount of less than 35 ppb, or in an amount of less than 15 ppb. However, in the absence of nitrogen atoms, chipping in the single-crystal diamond cannot be sufficiently suppressed, and therefore the single-crystal diamond may contain nitrogen atoms preferably in an amount of greater than or equal to 0.05 ppb. Here, the impurity element means an element (heterogeneous element) other than carbon which is a principal constituent element of the single-crystal diamond.

A single-crystal diamond according to one embodiment of the present invention contains silicon as an impurity element in an amount of less than 1000 ppb. Since the single-crystal diamond contains silicon atoms as impurity element atoms only in an amount of less than 1000 ppb, the single-crystal diamond has a high purity and high light transmittance, and has a low concentration of silicon atoms as heterogeneous element atoms that disturb extension of chipping in application of strong stress to a specific portion, and therefore large chipping over a long distance easily occurs, but since a large number of crystal defect lines themselves, and relaxation of stress by the crystal defect lines disturb extension of chipping, occurrence of large chipping is suppressed. Thus, the single-crystal diamond of this embodiment which contains silicon atoms as impurity element atoms in an amount of less than 1000 ppb is suitably used for applications of semiconductor materials (diodes, transistors and the like), electronic components (resistive parts, capacitive parts and the like), heat dissipation materials (heat sinks), optical components (window materials, lenses and the like), ornament materials, cutting tools, polishing tools and the like. Further, for significantly exhibiting the above-mentioned effect, the single-crystal diamond of this embodiment may contain silicon atoms as impurity element atoms in an amount of less than 200 ppb, in an amount of less than 50 ppb, in an amount of less than 5 ppb, in an amount of less than 0.5 ppb, in an amount of less than 0.05 ppb, or in an amount of less than 0.005 ppb. However, in the absence of silicon atoms, chipping in the single-crystal diamond cannot be sufficiently suppressed, and therefore the single-crystal diamond may contain silicon atoms preferably in an amount of greater than or equal to 0.0005 ppb.

A single-crystal diamond according to one embodiment of the present invention contains impurity elements other than nitrogen and silicon in an amount of less than 500 ppb. Since the single-crystal diamond contains impurity element atoms other than nitrogen atoms and silicon atoms only in an amount of less than 500 ppb, the single-crystal diamond has a high purity and high light transmittance, and has a low concentration of impurity element atoms other than nitrogen atoms and silicon atoms, which are heterogeneous element atoms that disturb extension of chipping in application of strong stress to a specific portion, and therefore large chipping over a long distance easily occurs, but since a large number of crystal defect lines themselves, and relaxation of stress by the crystal defect lines disturb extension of chipping, occurrence of large chipping is suppressed. Thus, the single-crystal diamond of this embodiment which contains impurity element atoms other than nitrogen atoms and silicon atoms as impurity element atoms in an amount of less than 500 ppb is suitably used for applications of semiconductor materials (diodes, transistors and the like), electronic components (resistive parts, capacitive parts and the like), heat dissipation materials (heat sinks), optical components (window materials, lenses and the like), ornament materials, cutting tools, polishing tools and the like. Further, for significantly exhibiting the above-mentioned effect, the single-crystal diamond of this embodiment may contain impurity element atoms other than nitrogen atoms and silicon atoms in an amount of less than 200 ppb, in an amount of less than 100 ppb, or in an amount of less than 75 ppb. However, in the absence of impurity element atoms other than nitrogen atoms and silicon atoms, chipping in the single-crystal diamond cannot be sufficiently suppressed, and therefore the single-crystal diamond may contain impurity element atoms other than nitrogen atoms and silicon atoms preferably in an amount of greater than or equal to 1 ppb.

In the single-crystal diamond of this embodiment, the transmittance of light having a wavelength of 500 nm may be greater than or equal to 55% and less than 71% when the single-crystal diamond has a thickness of 500 μm. Here, the light transmittance when the single-crystal diamond has a thickness of 500 μm is a light transmittance measured when the single-crystal diamond has a thickness of 500 μm, or a light transmittance determined by measuring a light transmittance when the thickness of the single-crystal diamond is not 500 μm, and converting the measured light transmittance to a value when the single-crystal diamond has a thickness of 500 μm. In addition, for correctly evaluating the light transmittance, it is preferable to polish the surface so that the surface scattering ratio is less than or equal to 2%. When the surface scattering occurs, the light transmittance means a regular transmittance with conversion performed for correcting surface scattering. The regular transmittance can be calculated from the measured transmittance in accordance with the conversion expression: (regular transmittance)= (measured transmittance)/(1−((surface scattering ratio)/100).

A conventional single-crystal diamond absorbs light having a wavelength of 500 nm due to a synergistic effect of crystal defects and impurity element atoms, so that the transmittance of light having such a wavelength decreases. However, since the single-crystal diamond of this embodiment has a high purity, the single-crystal diamond has a high light transmittance, and occurrence of large chipping is suppressed while the transmittance of light having a wavelength of 500 nm is greater than or equal to 55% when the thickness is 500 μm. From the viewpoint of suppressing occurrence of large chipping and exhibiting a high light transmittance, the light transmittance is preferably greater than or equal to 55%, more preferably greater than or equal to 60%, still preferably greater than or equal to 65%, especially preferably greater than or equal to 68%. Even in an ideal single-crystal diamond with impurities reduced to a limit, the light transmittance is less than 71%.

In the single-crystal diamond of this embodiment, groups of crystal defect points that are tip points at which crystal defect lines indicating lines having crystal defects in an X-ray topographic image for a crystal growth principal surface reach the crystal growth principal surface may aggregate. The single-crystal diamond is suitably used for cutting tools, polishing tools, optical components, electronic components, semiconductor materials and the like because the single-crystal diamond has a high purity and a high light transmittance, and stress is relaxed by a large number of crystal defect lines to suppress occurrence of large chipping.

In the single-crystal diamond of this embodiment, a plurality of crystal defect linear aggregation regions, where groups of crystal defect points that are tip points at which crystal defect lines indicating lines having crystal defects in an X-ray topographic image for a crystal growth principal surface reach the crystal growth principal surface aggregate and extend linearly in a direction at an angle less than or equal to 30° with respect to one arbitrarily specified direction, may be present in parallel. Since the single-crystal diamond has a high purity and high light transmittance, and a plurality of crystal defect linear aggregation regions, where groups of crystal defect points that are tip points at which crystal defect lines reach the crystal growth principal surface aggregate and extend linearly in a direction at an angle less than or equal to 30° with respect to one arbitrarily specified direction, are present in parallel, stress is relaxed by a large number of crystal defect lines to suppress occurrence of large chipping, and a direction in which chipping hardly occurs can be controlled by a plurality of crystal defect linear aggregation regions which are present in parallel, and extend linearly in a direction at an angle less than or equal to 30° with respect to one arbitrarily specified direction. Therefore, the single-crystal diamond is suitably used for cutting tools, polishing tools, optical components, electronic components, semiconductor materials and the like.

In the single-crystal diamond of this embodiment, two or more crystal defect linear aggregation regions may be present per 1 mm in a direction perpendicular to a direction in which the crystal defect linear aggregation regions extend linearly, and the distance between the crystal defect linear aggregation regions may be less than or equal to 500 μm in the direction in which the regions extend linearly. Here, the direction in which the crystal defect linear aggregation region extends linearly refers to the specified one direction which is an average direction in a plurality of directions in which a plurality of crystal defect linear aggregation regions extend respectively. Since the single-crystal diamond has a high purity and high light transmittance, two or more crystal defect linear aggregation regions are present per 1 mm in a direction perpendicular to a direction in which the crystal defect linear aggregation regions extend linearly, and the distance between the crystal defect linear aggregation regions is less than or equal to 500 μm in the direction in which the regions extend linearly, stress is relaxed by a large number of crystal defect lines to suppress occurrence of large chipping, and a direction in which chipping hardly occurs can be controlled by a plurality of dense crystal defect linear aggregation regions which are present in parallel in a direction at an angle less than or equal to 30° with respect to one arbitrarily specified direction.

In the single-crystal diamond of this embodiment, five or more long crystal defect linear aggregation regions having a length greater than or equal to 300 μm may be present per 1 cm$^2$ of the crystal growth principal surface. Since the single-crystal diamond has a high purity and high light transmittance, and five or more long crystal defect linear aggregation regions having a length greater than or equal to 300 μm are present per 1 cm$^2$ of the crystal growth principal surface, occurrence of large chipping in a single-crystal diamond is suppressed, and the strength of the single-crystal diamond as a whole is increased. From such a viewpoint, twenty or more longer crystal defect linear aggregation regions having a length greater than or equal to 500 μm may be present per 1 cm$^2$ of the principal surface.

In the single-crystal diamond of this embodiment, the density of crystal defect points may be greater than 20 mm$^{-2}$. Since the single-crystal diamond has a high purity and high light transmittance, and the density of crystal defect points is greater than 20 mm$^{-2}$, occurrence of large chipping is suppressed due to relaxation of stress by dense crystal defect lines corresponding to dense crystal defect points. Further, in the single-crystal diamond of this embodiment, the density of crystal defect points may be greater than 300 mm$^{-2}$. In the single-crystal diamond, occurrence of large chipping is further suppressed due to relaxation of stress by dense crystal defect lines corresponding to denser crystal defect points because the density of crystal defect points is greater than 300 mm$^{-2}$. Further, in the single-crystal diamond of this embodiment, the density of crystal defect points may be greater than 1500 mm$^{-2}$. In the single-crystal diamond, occurrence of large chipping is further suppressed due to relaxation of stress by dense crystal defect lines corresponding to further dense crystal defect points because the density of crystal defect points is greater than 1500 mm$^{-2}$.

In the single-crystal diamond of this embodiment, the density of complex dislocation points that are tip points at which complex dislocations obtained by combining any of a plurality of edge dislocations and a plurality of helical dislocations reach a crystal growth principal surface, among crystal defect points may be greater than 20 mm$^{-2}$. Since the single-crystal diamond has a high purity and high light transmittance, the density of complex dislocation points that are tip points at which complex dislocations reach a crystal growth principal surface is greater than 20 mm$^{-2}$, and the effect of relaxing stress by complex dislocations is high, occurrence of large chipping is further suppressed. Further, in the single-crystal diamond of this embodiment, the density of complex dislocation points that are tip points at which complex dislocations obtained by combining any of a plurality of edge dislocations and a plurality of helical dislocations reach a crystal growth principal surface, among crystal defect points may be greater than 30 mm$^{-2}$. In the single-crystal diamond, occurrence of large chipping is still further suppressed because the density of complex dislocation points that are tip points at which complex dislocations reach a crystal growth principal surface is greater than 30 mm$^{-2}$, and the effect of relaxing stress by complex dislocations is higher.

Further, in the single-crystal diamond of this embodiment, the density of complex dislocation points that are tip points at which complex dislocations obtained by combining any of a plurality of edge dislocations and a plurality of helical dislocations reach a crystal growth principal surface, among crystal defect points may be greater than 500 mm$^{-2}$. In the single-crystal diamond, occurrence of large chipping is still further suppressed because the density of complex dislocation points that are tip points at which complex dislocations reach a crystal growth principal surface is greater than 500 mm$^{-2}$, and the effect of relaxing stress by complex dislocations is higher. Further, in the single-crystal diamond of this embodiment, the density of complex dislocation points that are tip points at which complex dislocations obtained by combining any of a plurality of edge dislocations and a plurality of helical dislocations reach a crystal growth principal surface, among crystal defect points may be greater than 1000 mm$^{-2}$. In the single-crystal diamond, occurrence of large chipping is still further suppressed because the density of complex dislocation points that are tip points at which complex dislocations reach a crystal growth principal surface is greater than 1000 mm$^{-2}$, and the effect of relaxing stress by complex dislocations is higher.

The single-crystal diamond of this embodiment may include a plurality of single-crystal diamond layers. Since the single-crystal diamond has a high purity and high light transmittance, and includes a plurality of single-crystal diamond layers, formation of crystal defect lines is accelerated, so that occurrence of large chipping is further suppressed.

The single-crystal diamond of this embodiment includes a plurality of single-crystal diamond layers, crystal defect lines are newly generated or branched at interfaces between the single-crystal diamond layers, and crystal defect points at a crystal growth principal surface may be denser than crystal defect points at a principal surface opposite to the crystal growth principal surface. Since the single-crystal diamond has a high purity and high light transmittance, and crystal defect lines are newly generated or branched at interfaces between the single-crystal diamond layers, the number of crystal defect points at a crystal growth principal surface increases each time the number of single-crystal diamond layers increases, and therefore crystal defect points at a crystal growth principal surface are denser than crystal defect points at a principal surface opposite to the crystal growth principal surface, so that chipping resistance is further improved.

The single-crystal diamond of this embodiment includes a plurality of single-crystal diamond layers, crystal defect lines are newly generated, eliminated, branched or merged at interfaces between the single-crystal diamond layers, and crystal defect points at a crystal growth principal surface and crystal defect points at a crystal growth principal surface opposite to the foregoing crystal growth principal surface may be denser than crystal defect points at interfaces between single-crystal diamond layers. Since the single-crystal diamond has a high purity and high light transmittance, and crystal defect lines are newly generated, eliminated, branched or merged at interfaces between the single-crystal diamond layers, the number of crystal defect points at a crystal growth principal surface and the number of crystal defect points at the opposite crystal growth principal surface increase each time the number of single-crystal diamond layers increases, and therefore crystal defect points at the crystal growth principal surface and crystal defect points at the opposite crystal growth principal surface are denser than crystal defect points at interfaces between the single-crystal diamond layers, so that occurrence of large chipping at the principal surfaces on both sides is suppressed, and thus the principal surfaces on both sides have high chipping resistance, leading to improvement of strength.

In addition, in the single-crystal diamond, stress is relaxed by a large number of crystal defect lines to suppress occurrence of large chipping. Therefore, the single-crystal diamond is suitably used for semiconductor materials (diodes, transistors and the like), electronic components (resistive parts, capacitive parts and the like), heat dissipation materials (heat sinks), optical components (window materials, lenses and the like), ornament materials, cutting tools, polishing tools and the like.

The component including the single-crystal diamond of this embodiment is a component selected from the group consisting of a semiconductor substrate including the single-crystal diamond of this embodiment, a semiconductor material (diode, a transistor or the like), an electronic component (resistive part, capacitive part or the like), a heat dissipation material (heat sink or heat spreader), an optical component (window material, lens or the like), an ornament material, a biochip, a sensor and a semiconductor substrate. Since the component includes the single-crystal diamond of the embodiment, the component has a high purity and high light transmittance, is inhibited from having large chipping, and has high chipping resistance and high strength.

The tool including the single-crystal diamond of this embodiment is a tool selected from the group consisting of a cutting bite, a milling cutter, an end mill, a drill, a reamer, a cutter, a dresser, a wire guide, an extension wire die, a water jet nozzle, a diamond knife, a glass cut and a scriber, each of which includes the single-crystal diamond of this embodiment at a contact portion with a material to be cut. Since the tool includes the single-crystal diamond of this embodiment at a contact portion with a material to be cut, the tool has a high purity and high light transmittance, is inhibited from having large chipping, has high chipping resistance, high strength and a high purity, and is therefore excellent in wear resistance.

A chemical vapor deposition device according to one embodiment of the present invention is a chemical vapor deposition device to be used in the above-mentioned method for manufacturing a single-crystal diamond, the device including a chamber, and an auxiliary plate with a protective film, the auxiliary plate with the protective film being disposed in the chamber and having the protective film formed on at least a part of a surface of the auxiliary plate. The chemical vapor deposition device of this embodiment includes the auxiliary plate 8 with the protective film, which is disposed in a chamber, and thus the chemical vapor deposition device is capable of manufacturing the single-crystal diamond of the above-mentioned embodiment.

DETAILS OF EMBODIMENTS OF INVENTION

Embodiment 1: Method for Manufacturing Single-Crystal Diamond

A method for manufacturing a single-crystal diamond according to this embodiment will be described with reference to FIGS. 1 to 13.

Referring to FIGS. 1 to 4 and 7 to 9, the method for manufacturing a single-crystal diamond 20 according to this embodiment includes a step S1 of forming a protective film 5 on at least a part of a surface of an auxiliary plate 4; a step S2 of preparing a diamond seed crystal substrate 10; a step S3 of disposing auxiliary plate 8 with a protective film, in which protective film 5 is formed on auxiliary plate 4, and diamond seed crystal substrate 10 in chamber 2; and a step S4 of growing single-crystal diamond 20 on a principal surface of diamond seed crystal substrate 10 by a chemical vapor deposition (hereinafter, also referred to as "CVD") method while introducing a carbon-containing gas into chamber 2. With the method for manufacturing single-crystal diamond 20 according to this embodiment, a single-crystal diamond having a low content of impurity elements, high light transmissivity and excellent chipping resistance can be obtained because the method includes the above-mentioned steps.

(Step of Preparing Auxiliary Plate)

Figure 2:
FIG. 2 is a schematic sectional view showing an auxiliary plate with a protective film which is used in a method for manufacturing a single-crystal diamond according to one aspect of the present invention.
Figure 9:
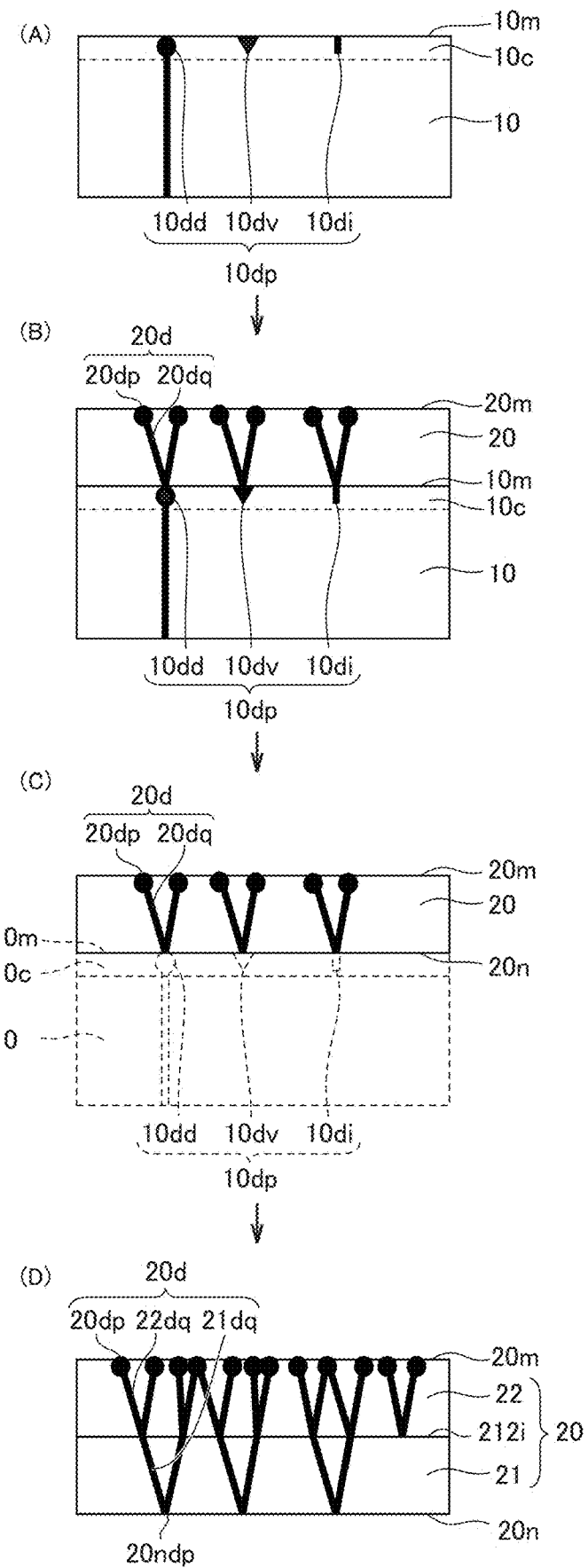
FIG. 9 is a schematic sectional diagram showing a method for manufacturing a single-crystal diamond according to one aspect of the present invention.

Referring to FIGS. 1, 2 and 9, auxiliary plate 4 to be prepared in the method for manufacturing single-crystal diamond 20 according to this embodiment is not particularly limited, and molybdenum, copper, aluminum, niobium, tantalum, quartz, sapphire, alumina, magnesium oxide, strontium titanate, yttria-stabilized zirconia or the like, which is stable in an oxidizing/reducing atmosphere of hydrogen etc., and can be relatively inexpensively obtained as a plate having a large area, is suitably used. Preferably, auxiliary plate 4 is formed of an oxide from the viewpoint of transmitting microwaves and being stable under a reducing atmosphere. Examples of the suitable oxide include quartz, sapphire, alumina (aluminum oxide), magnesia (magnesium oxide), strontium titanate and yttria-stabilized zirconia. The thickness of auxiliary plate 4 is preferably greater than or equal to 1 mm and less than or equal to 5 mm, more preferably greater than or equal to 1 mm and less than or equal to 3 mm from the viewpoint of ease of handling.

(Step S1 of Forming Protective Film on at Least a Part of Surface of Auxiliary Plate)

Referring to FIGS. 1, 2 and 9, auxiliary plate 8 with a protective film in which protective film 5 is formed on auxiliary plate 4 is prepared by forming protective film 5 on at least a part of a surface of auxiliary plate 4 in step S1 of forming a protective film on at least a part of a surface of an auxiliary plate in the method for manufacturing single-crystal diamond 20 according to this embodiment. Protective film 5 has a function of suppressing ingress of elements, which form auxiliary plate 4, into the single-crystal diamond, a function of suppressing ingress of impurity elements in chamber 2 into the single-crystal diamond, and so on as described in step S3 of disposing auxiliary plate 8 with a protective film, in which protective film 5 is formed on auxiliary plate 4, and diamond seed crystal substrate 10 in the chamber as described later. Protective film 5 can be obtained by, for example, forming a thin film of aluminum, titanium, vanadium, chromium, nickel, zirconium, niobium, molybdenum, hafnium, tantalum, tungsten, iridium or the like on a surface of auxiliary plate 4 using a vacuum sputtering method, a vacuum vapor deposition method, an ion plating method, an ion beam vapor deposition method or the like.

Preferably, protective film 5 is formed on a principal surface and a lateral surface of auxiliary plate 4. The thickness of protective film 5 is preferably greater than or equal to 0.5 µm, more preferably greater than or equal to 5 µm. The upper limit of the thickness of protective film 5 is not particularly limited, but is preferably less than or equal to 1000 µm from the viewpoint of ease of formation.

Protective film 5 is effective when formed on at least a part of a surface of auxiliary plate 4. The protective film ratio (%) defined by the percentage ratio of the area of protective film 5 to the area of an exposed surface of auxiliary plate 4 is preferably greater than or equal to 10%, more preferably greater than or equal to 30%, still more preferably greater than or equal to 50%, still more preferably greater than or equal to 75%, most preferably 100%.

Preferably, protective film 5 contains a metal element serving as a getter of elements other than carbon from the viewpoint of suppressing ingress of impurity elements in chamber 2 into the single-crystal diamond. The getter refers to one that adsorbs impurity elements in a chamber to suppress ingress of the impurity elements into a single-crystal diamond. Examples of the suitable metal element serving as a getter include metal elements that form a compound with oxygen, specifically aluminum, titanium, chromium, nickel, zirconium, molybdenum, hafnium, tungsten, iridium and the like.

(Step S2 of Preparing Diamond Seed Crystal Substrate)

Figure 4:
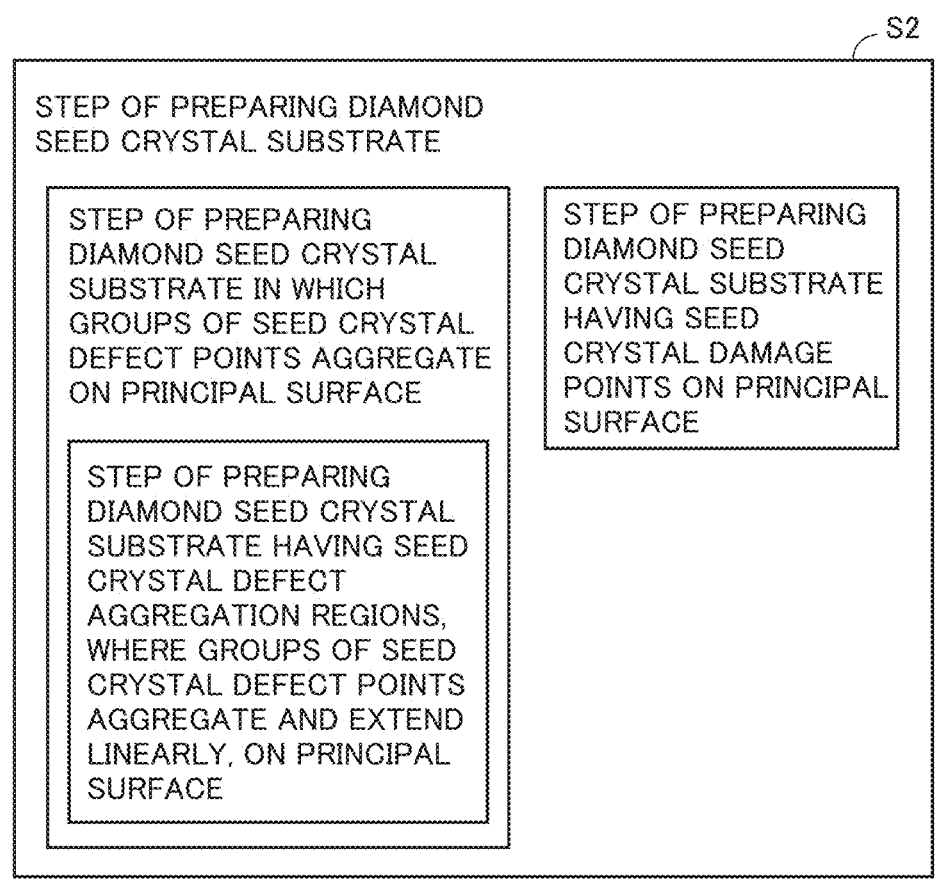
FIG. 4 is a diagram showing a step of preparing a diamond seed crystal substrate in a method for manufacturing a single-crystal diamond according to one aspect of the present invention.

Referring to FIGS. 1, 4, and 9, step S2 of preparing diamond seed crystal substrate 10 in the method for manufacturing single-crystal diamond 20 according to this embodiment is not particularly limited, but is preferably step S2 of preparing diamond seed crystal substrate 10 having seed crystal damage points on a principal surface 10m from the viewpoint of obtaining single-crystal diamond excellent in chipping resistance. Here, the density of seed crystal damage points is preferably greater than or equal to 3 mm$^{-2}$, more preferably greater than or equal to 5 mm$^{-2}$. Alternatively, step S2 is preferably step S2 of preparing CVD (chemical vapor deposition) diamond seed crystal substrate 10 in which groups of crystal defect points aggregate on principal surface 10m. Further, step S2 is more preferably step S2 of preparing diamond seed crystal substrate 10 having a seed crystal defect linear aggregation region in which groups of seed crystal defect points 10dp aggregate and extend linearly on principal surface 10m. That is, the method for manufacturing single-crystal diamond 20 includes the steps of: preparing diamond seed crystal substrate 10 having a seed crystal defect linear aggregation region in which groups of seed crystal defect points 10dp aggregate and extend linearly on principal surface 10m (FIG. 9(A)); and growing single-crystal diamond 20 on principal surface 10m of diamond seed crystal substrate 10 by a CVD (chemical vapor deposition) method (FIG. 9(B)).

Here, the principal surface (crystal growth principal surface) basically refers to a crystal growth surface. Alternatively, the principal surface refers to a polished surface on a side close to the crystal growth surface. In addition, the expression "groups of crystal defect points aggregate" is as follows. That is, crystal defect points 20dp are grouped such that a plurality of crystal defect points branched from one origination point or aggregations of crystal defect points branched in the middle between the origination point and the crystal defect points are put into one group, and crystal defect points derived from a different origination point are put into another group. When the smallest circle encompassing all crystal defect points in the same group is expressed as an area of a group, groups aggregate when an area of a group is in contact with or overlaps with an area of another group.

In the method for manufacturing single-crystal diamond 20 according to this embodiment, single-crystal diamond 20 in which groups of crystal defect points aggregate is obtained by growing single-crystal diamond 20 by a CVD method on principal surface 10m of diamond seed crystal substrate 10 which has seed crystal damage points with a density of preferably greater than or equal to 3 mm$^{-2}$, more preferably greater than or equal to 5 mm$^{-2}$ on principal surface 10m, or principal surface 10m of diamond seed crystal substrate 10 in which groups of seed crystal defect points 10dp aggregate on principal surface 10m. Single-crystal diamond 20 is suitably used for cutting tools, polishing tools, optical components, electronic components, semiconductor materials and the like because stress is relaxed by a large number of groups of crystal defect points to suppress occurrence of large chipping.

In the method for manufacturing single-crystal diamond 20 according to this embodiment, single-crystal diamond 20 in which a plurality of crystal defect linear aggregation regions 20r, where groups of crystal defect points 20dp that are tip points at which crystal defect lines 20dq reach a crystal growth principal surface 20m aggregate and extend linearly in a direction at an angle less than or equal to 30° with respect to one arbitrarily specified direction, are present in parallel is obtained by growing single-crystal diamond 20 by a CVD method on principal surface 10m of diamond seed crystal substrate 10 which has seed crystal defect linear aggregation regions where groups of seed crystal defect points 10dp aggregate and extend linearly on principal surface 10m. In single-crystal diamond 20, stress is relaxed by a large number of crystal defect lines 20dq to suppress occurrence of large chipping, and a direction in which chipping hardly occurs can be controlled by a plurality of crystal defect linear aggregation regions 20r which are present in parallel, and extend linearly in a direction at an angle less than or equal to 30° with respect to one arbitrarily specified direction (see FIGS. 5 and 6). Therefore, single-crystal diamond 20 is suitably used for cutting tools, polishing tools, optical components, electronic components, semiconductor materials and the like.

The step of preparing diamond seed crystal substrate 10 having seed crystal defect linear aggregation regions, where groups of seed crystal defect points 10dp aggregate and extend linearly, on principal surface 10m is not particularly limited, and may include, for example, a step of forming irregularities on principal surface 10m of diamond seed crystal substrate 10. The reason why irregularities are formed is that seed crystal defect point 10dp corresponding to the irregularities can be formed. The depth of the irregularities on principal surface 10m is preferably greater than or equal to 0.1 nm and less than or equal to 100 nm, more preferably greater than or equal to 1 nm and less than or equal to 70 nm. The irregularities on principal surface 10m may be random, but it is preferable that groups of irregularities aggregate to form linearly extending seed crystal defect linear aggregation regions. The irregularities on principal surface 10m can be formed by etching, polishing, photolithography, a laser or the like.

Figure 5:
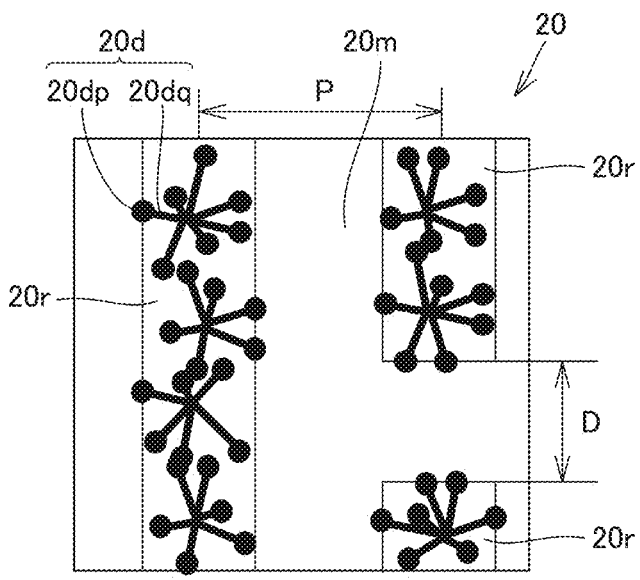
FIG. 5 is a schematic diagram showing an example of an X-ray topographic image of a crystal growth principal surface of a single-crystal diamond according to one aspect of the present invention.
Figure 6:
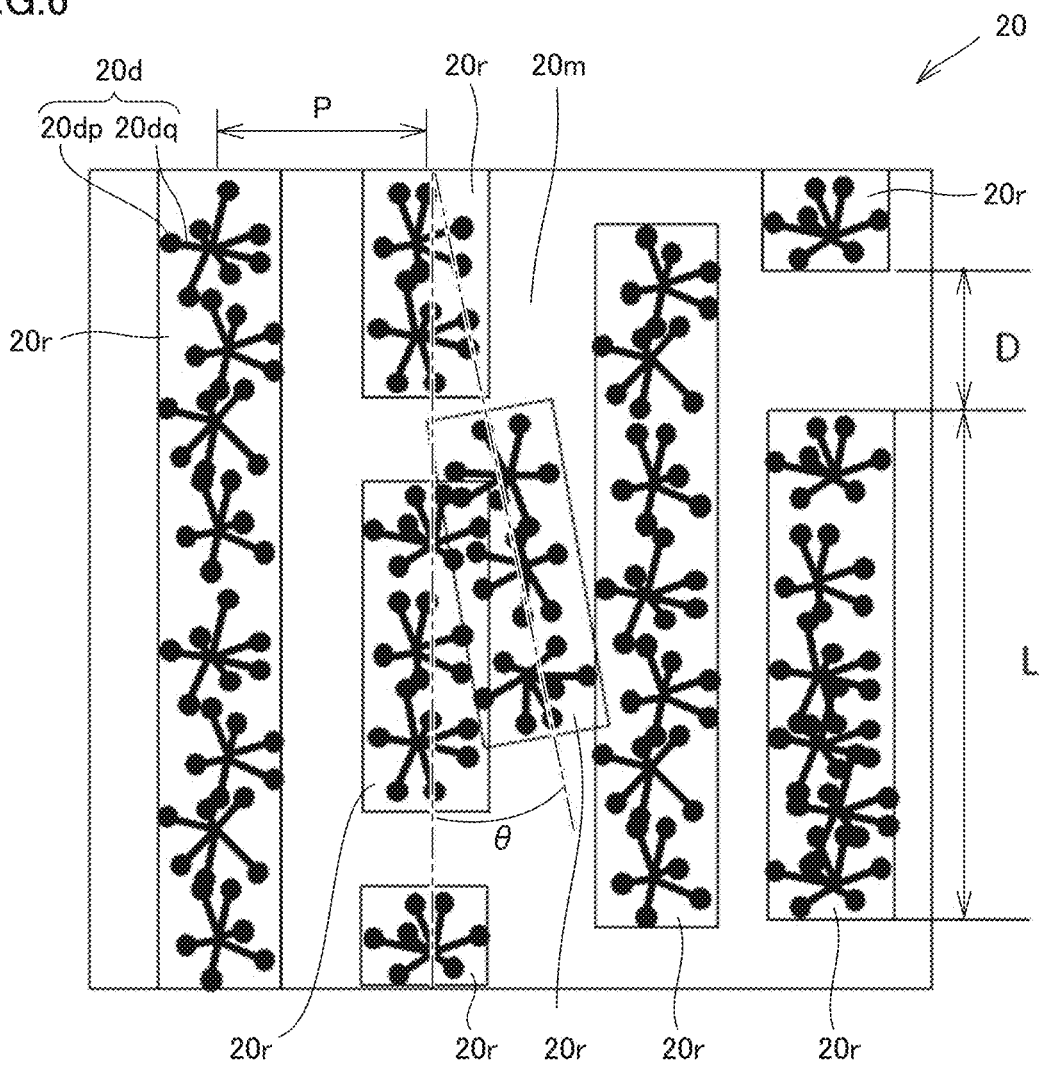
FIG. 6 is a schematic diagram showing a range wider than that in FIG. 5.

In the method for manufacturing single-crystal diamond 20 according to this embodiment, it is preferable that two or more seed crystal defect linear aggregation regions are present per 1 mm in a direction perpendicular to a direction in which the seed crystal defect linear aggregation regions extend linearly, and the distance between the seed crystal defect linear aggregation regions is less than or equal to 500 μm in the direction in which the regions extend linearly. In the method for manufacturing single-crystal diamond 20, two or more seed crystal defect linear aggregation regions are present per 1 mm in a direction perpendicular to a direction in which the seed crystal defect linear aggregation regions extend linearly, and the distance between the seed crystal defect linear aggregation regions is less than or equal to 500 μm in the direction in which the regions extend linearly. Thus, single-crystal diamond 20 in which two or more crystal defect linear aggregation regions 20r shown in FIGS. 5 and 6 are present per 1 mm in a direction perpendicular to a direction in which the crystal defect linear aggregation regions extend linearly, and a distance D between the crystal defect linear aggregation regions is less than or equal to 500 μm in the direction in which the regions extend linearly can be obtained. Therefore, single-crystal diamond 20 can be obtained in which stress is relaxed by a large number of crystal defect lines 20dq to suppress occurrence of large chipping, and a direction in which chipping hardly occurs can be controlled by a plurality of dense crystal defect linear aggregation regions 20r which are present in parallel, and extend linearly in a direction at an angle less than or equal to 30° with respect to one arbitrarily specified direction.

From the above-mentioned viewpoint, it is more preferable that four or more seed crystal defect linear aggregation regions are present per 1 mm in a direction perpendicular to a direction in which the seed crystal defect linear aggregation regions linearly extend, and/or the distance between the seed crystal defect linear aggregation regions is less than or equal to 100 μm in the direction in which the regions extend linearly. The pitch between a plurality of seed crystal linear aggregation regions which are present in parallel is preferably less than or equal to 500 μm, and more preferably less than or equal to 250 μm.

In the method for manufacturing single-crystal diamond 20 according to this embodiment, it is preferable that five or more long seed crystal defect linear aggregation regions having a length greater than or equal to 300 μm are present per 1 cm$^2$ of the principal surface. In the method for manufacturing single-crystal diamond 20, occurrence of large chipping in single-crystal diamond 20 to be grown is suppressed, and the strength of single-crystal diamond 20 as a whole is increased because five or more long seed crystal defect linear aggregation regions having a length greater than or equal to 300 μm are present per 1 cm$^2$ of the principal surface. From such a viewpoint, it is more preferable that twenty or more longer seed crystal defect linear aggregation regions having a length greater than or equal to 500 μm are present per 1 cm$^2$ of the principal surface.

In the method for manufacturing single-crystal diamond 20 according to this embodiment, the density of seed crystal defect points 10dp is preferably greater than 10 mm$^{-2}$. In the method for manufacturing single-crystal diamond 20, the density of seed crystal defect points 10dp is greater than 10 mm$^{-2}$, and thus a single-crystal diamond in which the density of crystal defect points 20dp that are tip points at which crystal defect lines 20dq reach crystal growth principal surface 20m is greater than 20 mm$^{-2}$ can be obtained by a CVD (chemical vapor deposition) method. Therefore, single-crystal diamond 20 can be obtained in which stress is relaxed by dense crystal defect lines 20dq to suppress occurrence of large chipping. From such a viewpoint, the density of seed crystal defect points 10dp is more preferably greater than 100 mm$^{-2}$, still more preferably greater than 1000 mm$^{-2}$, especially preferably greater than $1 \times 10^4$ mm$^{-2}$. For example, when the density of seed crystal defect points 10dp is greater than 100 mm$^{-2}$, a single-crystal diamond in which the density of crystal defect points 20dp that are tip points at which crystal defect lines 20dq reach crystal growth principal surface 20m is greater than 300 mm$^{-2}$ can be obtained by a CVD method. In addition, for example, when the density of seed crystal defect points 10$dp$ is greater than 300 mm$^{-2}$, a single-crystal diamond in which the density of crystal defect points 20$dp$ that are tip points at which crystal defect lines 20$dq$ reach crystal growth principal surface 20$m$ is greater than 1500 mm$^{-2}$ can be obtained by a CVD method. Further, for example, when the density of seed crystal defect points 10$dp$ is greater than 1000 mm$^{-2}$, a single-crystal diamond in which the density of crystal defect points 20$dp$ that are tip points at which crystal defect lines 20$dq$ reach crystal growth principal surface 20$m$ is greater than 3000 mm$^{-2}$ can be obtained by a CVD method.

In the method for manufacturing single-crystal diamond 20 according to this embodiment, seed crystal defect points 10$dp$ and seed crystal defect linear aggregation regions are favorably shown in an X-ray topographic image measured in a transmission mode in a direction perpendicular to principal surface 10$m$ of diamond seed crystal substrate 10 (i.e. X-ray topographic image of principal surface 10$m$ of diamond seed crystal substrate 10).

Figure 12:
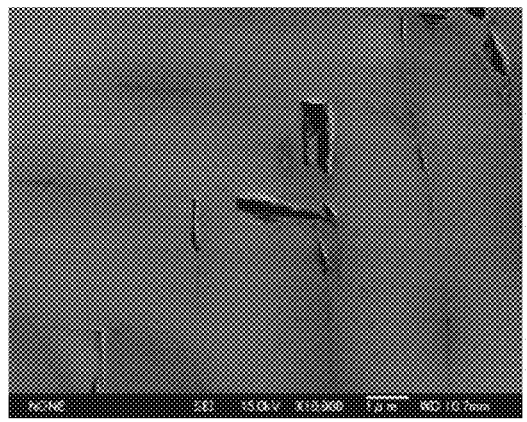
FIG. 12 is a photograph showing an example of an electron-microscopic secondary electron image showing a state of a principal surface of a diamond seed crystal substrate.
Figure 13:
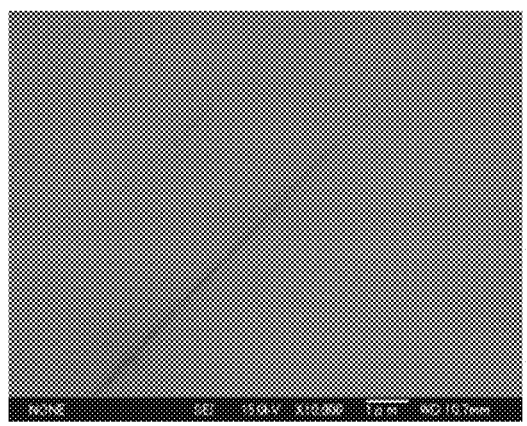
FIG. 13 is a photograph showing another example of an electron-microscopic secondary electron image showing a state of a principal surface of a diamond seed crystal substrate.

Referring to FIGS. 9, 12 and 13, in the method for manufacturing single-crystal diamond 20 according to this embodiment, the density of seed crystal damage points 10$di$ indicating points at which crystal damage is present is preferably greater than 3 mm$^{-2}$ in a secondary electron image in an electron microscope after principal surface 10$m$ of diamond seed crystal substrate 10 is hydrogen-terminated. In the method for manufacturing single-crystal diamond 20, the density of seed crystal damage points 10$di$ that generate a large number of crystal defect lines 20$dq$ particularly in single-crystal diamond 20 grown by a chemical vapor deposition method, among seed defect points, is greater than 3 mm$^{-2}$, and thus single-crystal diamond 20 having dense crystal defect lines 20$dq$ can be obtained by a CVD (chemical vapor deposition) method. Therefore, a single-crystal diamond can be obtained in which stress is relaxed by dense crystal defect lines 20$dq$ to suppress large chipping. From such a viewpoint, the density of seed crystal damage points 10$di$ indicating points at which crystal damage is present is preferably greater than 30 mm$^{-2}$ in a secondary electron image in an electron microscope after principal surface 10$m$ of diamond seed crystal substrate 10 is hydrogen-terminated.

Here, the method for subjecting principal surface 10$m$ of diamond seed crystal substrate 10 to a hydrogen termination treatment is not particularly limited, but from the viewpoint of effectively performing the treatment, principal surface 10$m$ of diamond seed crystal substrate 10 is irradiated with a hydrogen plasma generated by introducing a microwave at 2.400 GHz to 2.497 GHz or 902 MHz to 928 MHz or performing heating with a hot filament under a reduced-pressure atmosphere fed with hydrogen gas. Here, the temperature of diamond seed crystal substrate 10 is preferably less than or equal to 800° C., more preferably less than or equal to 600° C. from the viewpoint of preventing a change in shape of principal surface 10$m$ of diamond seed crystal substrate 10. In addition, the temperature of diamond seed crystal substrate 10 is preferably greater than or equal to 400° C. so that hydrogen termination proceeds. The hydrogen termination treatment time is preferably greater than or equal to 3 minutes from the viewpoint of reliably performing the hydrogen termination treatment, and preferably less than or equal to 15 minutes from the viewpoint of ensuring that the substrate is not etched.

As described above, principal surface 10$m$ of diamond seed crystal substrate 10 hydrogen-terminated has a negative electronegativity, and therefore carriers excited by primary electrons from an electron microscope can be easily detected as secondary electrons, so that a secondary electron image can be observed as a distribution of defects that trap carriers in the crystal. Thus, not only when principal surface 10$m$ has distinct defects such as cracks as shown in FIG. 12 but also when principal surface 10$m$ has no distinct defects as shown in FIG. 13, crystal damages including fine cracks, fine strains and the like in addition to the above-mentioned crystal defects, and the density thereof can be evaluated. Specifically, in FIGS. 12 and 13, the above-mentioned crystal damages are observed as dark spots for fine cracks, and as light-dark changes for fine strains. Here, for increasing the sensitivity to seed crystal damage points present on a surface of diamond seed crystal substrate 10, the accelerating voltage is preferably less than or equal to 15 kV.

In the method for manufacturing single-crystal diamond 20 according to this embodiment, the size of the principal surface of diamond seed crystal substrate 10 is preferably greater than or equal to 3 mm in diameter, more preferably greater than or equal to 6 mm, still more preferably greater than or equal to 10 mm in diameter from the viewpoint of growing a single-crystal diamond having a large diameter.

Referring to FIGS. 1, 4 and 9(A), step S2 of preparing diamond seed crystal substrate 10 for obtaining single-crystal diamond 20 in which groups of crystal defect points 20$dp$ aggregate on principal surface 20$m$ is not particularly limited, and from the viewpoint of efficiently preparing diamond seed crystal substrate 10 for obtaining single-crystal diamond 20 in which groups of crystal defects 20$dp$ aggregate on principal surface 20$m$, step S2 may include a sub-step of forming seed crystal defect points 10$dp$ and/or seed crystal damage points 10$di$ on principal surface 10$m$ of diamond seed crystal substrate 10; a sub-step of examining the density of seed crystal defect points 10$dp$ and/or seed crystal damage points 10$di$ on principal surface 10$m$ of diamond seed crystal substrate 10; and a sub-step of forming a conductive layer region 10$c$ by injecting ions on the principal surface 10$m$ side of diamond seed crystal substrate 10.

Referring to FIGS. 1, 4 and 9(A), step S2 of preparing diamond seed crystal substrate 10 for obtaining single-crystal diamond 20 in which groups of crystal defect points 20$dp$ aggregate on principal surface 20$m$ is not particularly limited, and from the viewpoint of efficiently preparing diamond seed crystal substrate 10 in which groups of seed crystal defects 10$dp$ aggregate on principal surface 10$m$, step S2 may include a sub-step of forming seed crystal defect points 10$dp$ and/or seed crystal damage points 10$di$ so that groups of seed crystal defect points 10$dp$ aggregate on principal surface 10$m$ of diamond seed crystal substrate 10; a sub-step of examining the density of seed crystal defect points 10$dp$ and/or seed crystal damage points 10$di$ on principal surface 10$m$ of diamond seed crystal substrate 10; and a sub-step of forming a conductive layer region 10$c$ by injecting ions on the principal surface 10$m$ side of diamond seed crystal substrate 10.

Referring to FIGS. 1, 4 and 9(A), step S2 of preparing diamond seed crystal substrate 10 having seed crystal defect linear aggregation regions, where groups of seed crystal defect points 10$dp$ aggregate linearly and extend linearly, on principal surface 10$m$ is not particularly limited, and from the viewpoint of efficiently preparing diamond seed crystal substrate 10 having seed crystal defect linear aggregation regions, where groups of seed crystal defect points 10$dp$ aggregate and extend linearly, on principal surface 10$m$, step S2 may include a sub-step of forming seed crystal defect linear aggregation regions, where groups of seed crystal defect points 10$dp$ aggregate and extend linearly, on principal surface 10m of diamond seed crystal substrate 10; a sub-step of examining the density of seed crystal defect points 10dp and seed crystal damage points 10di on principal surface 10m of diamond seed crystal substrate 10; and a sub-step of forming a conductive layer region 10c by injecting ions on the principal surface 10m side of diamond seed crystal substrate 10.

First, as diamond seed crystal substrate 10, a Ib type single-crystal diamond or IIa type single-crystal diamond grown by a high-temperature and high-pressure method, and a single-crystal diamond grown by the CVD (chemical vapor deposition) method with the Ib type single-crystal diamond or IIa type single-crystal diamond as a seed crystal substrate are prepared.

In the sub-step of forming seed crystal defect linear aggregation regions, where groups of seed crystal defect points 10dp aggregate and extend linearly, on principal surface 10m of diamond seed crystal substrate 10, seed crystal defect points 10dp include various kinds of defect points such as seed crystal point defect points, seed crystal dislocation points 10dd (tip points at which dislocations such as edge dislocations, helical dislocations, and complex dislocations obtained by combining any of a plurality of edge dislocations and a plurality of helical dislocations reach principal surface 10m), seed crystal chipping points 10dv, seed crystal crack points and seed crystal damage points 10di. In addition, the method for forming a seed crystal defect linear aggregation region is not particularly limited, and the seed crystal defect linear aggregation region may be formed by, for example, forming a linear mask using a photolithography method, and then a plasma-etching a portion where a mask is not formed. In addition, the seed crystal defect linear aggregation region may be formed by laser processing. The seed crystal defect linear aggregation region may be formed by mechanical polishing with a whetstone obtained by bonding diamond abrasive grains with a metal, or a whetstone obtained by dispersing diamond abrasive grains in cast iron. Further, cracks as origination points for dislocations can be further accurately controlled by performing reactive ion etching (RIE), microwave plasma etching or ion milling after such mechanical polishing. In particular, when a mask is formed, and ME is performed, it is preferable to perform dry etching with oxygen ($O_2$), and carbon tetrafluoride ($CF_4$) at a flow rate (unit: sccm) that is 1% or less of the flow rate (unit: sccm) of $O_2$. In this way, acicular irregularities are easily formed after dry etching, so that origination points of crystal defect lines are easily developed after CVD (chemical vapor deposition).

From the viewpoint of growing single-crystal diamond 20 having crystal defect linear aggregation regions 20r extending linearly in a preferred direction, the direction in which seed crystal defect linear aggregation regions extend linearly is preferably a direction at an angle less than or equal to 30°, more preferably a direction at an angle less than or equal to 15° with respect to the <100> direction.

Here, the crack refers to a hole made to a depth greater than or equal to 1 μm, or a linear crack having a length of 1 μm to 10 μm. The latter refers to a very small cleavage which is particularly easily formed principally in the <110> direction. The crack point refers to a tip point at which a crack reaches principal surface 10m. In addition, the crystal damage refers to a very small hole made to a depth of less than 1 μm, and a very small crack of less than 1 μm, a crystal strain, or the like. The crystal damage point refers to a tip point at which a crystal damage reaches principal surface 10m. The arithmetic average roughness Ra (arithmetic average roughness Ra defined in JIS B 0601: 2013) of principal surface 10m after processing of a seed crystal is preferably 0.1 nm to 30 nm. In addition, here it is preferable that principal surface 10m has an off angle of greater than or equal to 2° and less than or equal to 15° with respect to the (001) plane. The off direction of principal surface 10m is preferably at an angle less than or equal to 15° with respect to the <100> direction, or at an angle less than or equal to 15° with respect to the <110> direction. When the off angle is less than 2° with respect to the (001) plane of principal surface 10m, the off direction is not particularly limited, and it is preferable to perform CVD growth at a higher pressure as compared to a case where the off angle is greater than or equal to 2° and less than or equal to 15° with respect to the (001) plane of principal surface 10m.

It is preferable that with the above-mentioned method, seed crystal defect linear aggregation regions are formed on principal surface 10m of diamond seed crystal substrate 10 in such a manner that two or more seed crystal defect linear aggregation regions are present per 1 mm in a direction perpendicular to a direction in which the seed crystal defect linear aggregation regions extend, and the distance between the seed crystal defect linear aggregation regions is less than or equal to 500 μm in the direction in which the regions extend linearly.

It is preferable that in the sub-step of examining the density of seed crystal defect points 10dp and seed crystal damage points 10di, the density of seed crystal defect points 10dp is confirmed to be greater than 10 $mm^{-2}$ by observing an image in an optical microscope and/or X-ray topography. In addition, it is preferable that after principal surface 10m of diamond seed crystal substrate 10 is hydrogen-terminated, the density of seed crystal damage points 10di is confirmed to be greater than 3 $mm^{-2}$ by observing a secondary electron image of principal surface 10 m in an electron microscope. Here, when the density of seed crystal defect points 10dp is less than or equal to 10 $mm^{-2}$ and/or the density of seed crystal damage points 10di is less than or equal to 3 $mm^{-2}$, it is preferable to repeat the sub-step of forming seed crystal defect linear aggregation regions while changing conditions. In addition, when the density of seed crystal defect points 10dp is greater than $1 \times 10^6$ $mm^{-2}$ and/or the density of seed crystal damage points 10di is greater than $5 \times 10^5$ $mm^{-2}$, it is preferable to reduce at least one of the density of seed crystal defect points and the density of seed crystal damage points by etching etc.

Here, when diamond seed crystal substrate 10 is of n-type in which a large number of donor atoms such as nitrogen atoms and phosphorus atoms are present, the band may rise near a hydrogen-terminated surface, leading to hindrance of release of secondary electrons. Thus, even when a Ib type single-crystal diamond is used as diamond seed crystal substrate 10, seed crystal damage points 10di can be observed, but the donor density of diamond seed crystal substrate 10 is preferably less than or equal to 30 ppm, more preferably less than or equal to 1 ppm, and it is preferable that as diamond seed crystal substrate 10, a IIa type single-crystal diamond or a single-crystal diamond grown by a CVD (chemical vapor deposition) method is used.

The sub-step of forming conductive layer region 10c on the principal surface 10m side of the diamond seed crystal substrate 10 is performed by implanting ions to the principal surface 10m side of diamond seed crystal substrate 10. As ions, ions of carbon, hydrogen, lithium, boron, nitrogen, oxygen or phosphorus are preferably used.

(Step S3 of Disposing Auxiliary Substrate with Protective Film and Diamond Seed Crystal Substrate in Chamber)

Figure 3:
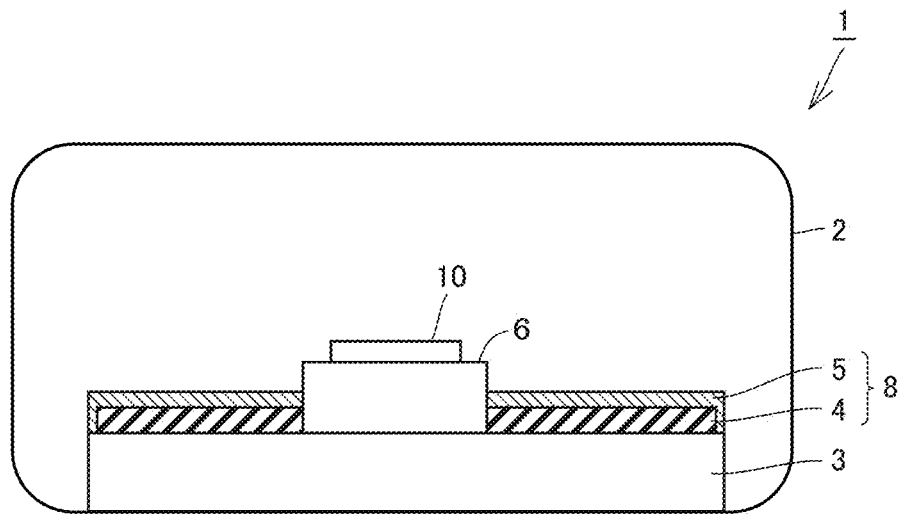
FIG. 3 is a schematic view illustrating a typical example of a configuration of a chemical vapor deposition device according to one aspect of the present invention.

Referring to FIG. 3, a device for manufacturing a single-crystal diamond, e.g. a CVD device 1 (chemical vapor deposition device) has a substrate support member 3 provided in chamber 2. Normally, chamber 2 is formed of a quartz tube, and substrate support member 3 is formed of copper. A substrate holder 6 is disposed on the upper surface of substrate support member 3. Diamond seed crystal substrate 10 is disposed on the upper surface of substrate holder 6. With reference to FIGS. 3 and 9, diamond seed crystal substrate 10 is disposed so as to expose principal surface 10m thereof. Referring to FIG. 3, auxiliary plate 8 with a protective film in which protective film 5 is formed on auxiliary plate 4 is disposed on the upper surface of substrate support member 3. Auxiliary plate 8 with a protective film is disposed so as to expose at least a part of protective film 5. Preferably, substrate holder 6 and auxiliary plate 8 with a protective film are disposed so as to cover the entire upper surface of substrate support member 3.

Referring to FIGS. 3 and 9, raw material carbon is precipitated as graphite or diamond-like carbon on the upper surface of substrate support member 3 in growth of single-crystal diamond 20 on diamond seed crystal substrate 10 when the upper surface of substrate support member 3 formed of copper is exposed. Precipitated carbon such as graphite precipitated on substrate support member 3 is easily suspended in an atmosphere, and the precipitated carbon is caught in a single-crystal diamond grown on diamond seed crystal substrate 10.

Thus, in a conventional CVD device, auxiliary plate 4 is disposed on the upper surface of substrate support member 3. Raw material carbon is also precipitated as graphite or the like on auxiliary plate 4, but since a quartz plate as auxiliary plate 4 is capable of firmly holding the precipitated carbon, the precipitated carbon is hardly suspended in an atmosphere. Therefore, by disposing a quartz plate as auxiliary plate 4 on substrate supporting member 3, precipitated carbon can be inhibited from being caught in the single-crystal diamond grown on diamond seed crystal substrate 10.

However, when a quartz plate is disposed as auxiliary plate 4 on substrate support member 3, silicon contained in the quartz plate is mixed in the single-crystal diamond as an impurity element in growth of single-crystal diamond 20 on diamond seed crystal substrate 10.

Thus, in the CVD device that is used in the method for manufacturing a single-crystal diamond according to this embodiment, auxiliary plate 8 with a protective film in which protective film 5 is formed on at least a part of a surface of auxiliary plate 4 is used, so that precipitated carbon can be inhibited from being caught in single-crystal diamond 20, and ingress of silicon into single-crystal diamond 20 can be suppressed.

(Step S4 of Growing Single-Crystal Diamond)

Referring to FIGS. 1 to 4 and 9(B), step S4 of growing single-crystal diamond 20 in the method for manufacturing single-crystal diamond 20 according to this embodiment is carried out by growing single-crystal diamond 20 on principal surface 10m of diamond seed crystal substrate 10 by a CVD method while introducing a carbon-containing gas into chamber 2. As the CVD method, a microwave plasma CVD method, a DC plasma CVD method, a hot filament CVD method or the like is suitably used. As the carbon-containing gas, $CH_4$, $C_2H_6$, $C_2H_4$, $C_2H_2$, $CH_3OH$, $C_2H_5OH$, $(CH_3)_2CO$ or the like is suitably used. In addition, as single-crystal growing gas other than a carbon-containing gas, hydrogen, argon, oxygen, carbon monoxide, carbon dioxide or the like is suitably used.

Preferably, the gas to be introduced into chamber 2 contains carbon and oxygen. Oxygen in the gas has an action of preventing ingress of impurity elements such as nitrogen and silicon into single-crystal diamond 20 and preferentially etching graphite formed concurrently with single-crystal diamond 20. Therefore, the resulting single-crystal diamond has a high purity and high light transmittance, and is optically transparent. That is, it has been heretofore necessary to use an expensive raw material gas with a high purity for obtaining a single-crystal diamond with a high purity, but in this embodiment, a single-crystal diamond with a high purity can be grown by introducing a gas containing oxygen in addition to carbon, and using auxiliary plate 8 with a protective film in which protective film 5 is formed on at least a part of a surface of auxiliary plate 4.

As the oxygen-containing gas, for example, $CO_2$, $O_2$, CO, $CH_3OH$, $C_2H_5OH$, $(CH_3)_2CO$, $H_2O$ or the like is suitably used.

The volume ratio of, for example, $CH_4$, $O_2$ and $H_2$ in a combination of gases containing carbon and oxygen, which are introduced into chamber 2, is preferably 1:0.01:3 to 1:0.8:100, more preferably 1:0.05:3 to 1:0.8:100. When the amount of the oxygen-containing gas exceeds 60% by volume of the total amount of the gases containing carbon and oxygen, the oxygen-containing gas etches single-crystal diamond 20 grown on diamond seed crystal substrate 10, so that the growth rate of single-crystal diamond 20 is reduced.

The thickness of single-crystal diamond 20 to be grown is not particularly limited, but is preferably greater than or equal to 300 µm, more preferably greater than or equal to 500 µm from the viewpoint of favorably forming a semiconductor material, an electronic component, a heat dissipation component, an optical component, an electronic component, a cutting tool, a polishing tool or the like. From the viewpoint of preventing breakage caused by stress in diamond seed crystal substrate 10, the thickness of single-crystal diamond 20 is preferably less than or equal to 1500 µm, more preferably less than or equal to 1000 µm. When single-crystal diamond 20 having a thickness greater than 1000 µm is grown, it is preferable that a first single-crystal diamond layer 21 having a thickness of less than or equal to 500 µm, diamond seed crystal substrate 10 is then removed as described later, and a second single-crystal diamond layer 22 is then grown as additional single-crystal diamond 20 on first single-crystal diamond layer 21.

Figure 8:
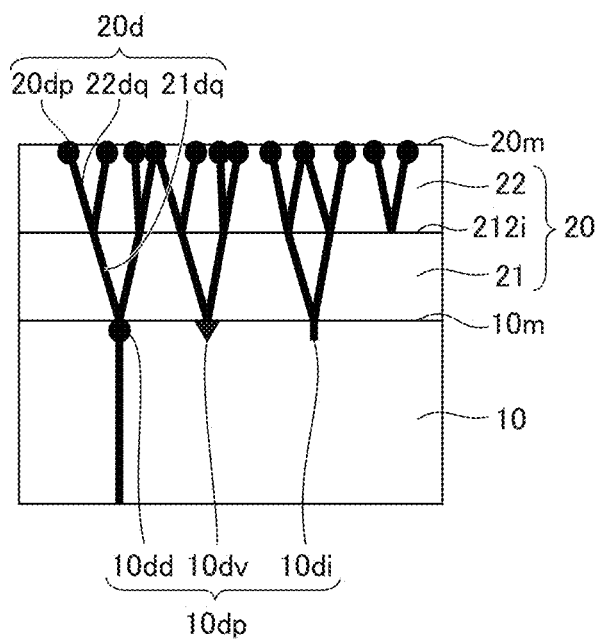
FIG. 8 is a schematic sectional diagram showing another example of a cross-section perpendicular to a crystal growth principal surface of a single-crystal diamond according to one aspect of the present invention.

When single-crystal diamond 20 including a plurality of single-crystal diamond layers 21 and 22 is grown as shown in FIG. 8, first single-crystal diamond layer 21 and second single-crystal diamond layer 22 may be successively grown as single-crystal diamond 20 on diamond seed crystal substrate 10. However, when single-crystal diamond 20 having a large thickness (e.g. a thickness greater than 1000 µm), it is preferable that as shown in FIGS. 9(B) to 9(D), first single-crystal diamond layer 21 having a thickness of less than or equal to 500 µm is formed, diamond seed crystal substrate 10 is then removed, and second single-crystal diamond layer 22 is then added and grown from the viewpoint of preventing breakage of diamond seed crystal substrate 10 due to an increase in thickness of single-crystal diamond 20.

(Step of Removing Diamond Seed Crystal Substrate)

Referring to FIG. 9(C), the method for manufacturing single-crystal diamond 20 according to this embodiment may further include a step of removing diamond seed crystal substrate 10 from the viewpoint of efficiently obtaining single-crystal diamond 20.

Preferably, the step of removing diamond seed crystal substrate 10 includes removing diamond seed crystal substrate 10 by laser cutting from the viewpoint of efficiently removing diamond seed crystal substrate 10. In addition, it is also preferable that by electrochemical etching such as electrolytic etching, conductive layer region 10c formed by injecting ions into diamond seed crystal substrate 10 is decomposed and removed to remove diamond seed crystal substrate 10.

(Step of Adding and Growing Single-Crystal Diamond)

Referring to FIG. 9(D), the method for manufacturing single-crystal diamond 20 according to this embodiment may further include a step of adding and growing single-crystal diamond 20 from the viewpoint of obtaining single-crystal diamond 20 which is further inhibited from having large chipping.

The step of adding and growing single-crystal diamond 20 is carried out by growing second single-crystal diamond layer 22 by a CVD method on the principal surface of first single-crystal diamond layer 21 which is single-crystal diamond 20 having been grown already. In first single-crystal diamond layer 21, crystal defect lines 21dq originating from defects at seed crystal defect points 10dp on principal surface 10m of diamond seed crystal substrate 10 extend in a crystal growth direction as shown in FIG. 9(C). In second single-crystal diamond layer 22 grown on first single-crystal diamond layer 21 by a CVD method, tips at which crystal defect lines 22dq originating from defects at crystal defect lines 21dq extend in a crystal growth direction and reach crystal growth principal surface 20m of single-crystal diamond 20 are crystal defect points 20dp.

Here, in general, a plurality of crystal defect lines 21dq originate from one seed crystal defect point 10dp of diamond seed crystal substrate 10 in first single-crystal diamond layer 21, and a plurality of crystal defect lines 22dq originate from one crystal defect line 21dq of diamond seed crystal substrate 10 in second single-crystal diamond layer 22. Therefore, as the number of single-crystal diamond layers 21 and 22 increases, the number of crystal defect points 20dp of single-crystal diamond 20 increase, so that occurrence of large chipping is further suppressed.

In the manner described above, single-crystal diamond 20 can be obtained which includes a plurality of single-crystal diamond layers 21 and 22 and in which crystal defect lines 21dq and 22dq are newly generated or branched at interfaces 212i between single-crystal diamond layers 21 and 22, and crystal defect points 20dp on crystal growth principal surface 20m are denser than crystal defect points 20ndp on a principal surface 20n opposite to crystal growth principal surface 20m as shown in FIG. 9(D).

Figure 10:
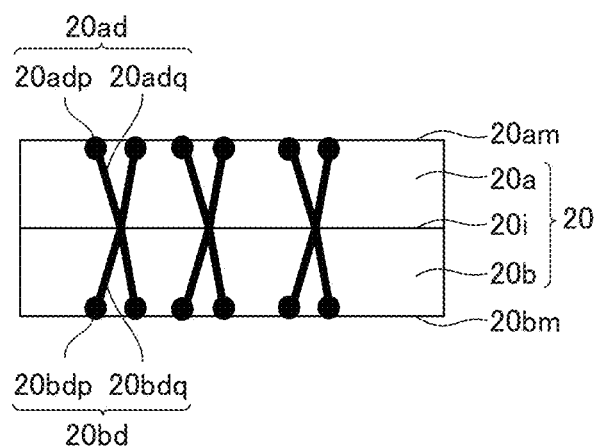
FIG. 10 is a schematic sectional diagram showing still another example of a cross-section perpendicular to a crystal growth principal surface of a single-crystal diamond according to one aspect of the present invention.

In addition, referring to FIGS. 9(C) and 10, the step of adding and growing single-crystal diamond 20 can be carried out by growing an additional single-crystal diamond by a CVD (chemical vapor deposition) method on principal surface 20n opposite to crystal growth principal surface 20m of single-crystal diamond 20 obtained as in FIG. 9(C). In this manner, single-crystal diamond 20 can be obtained which includes a plurality of single-crystal diamond layers 20a and 20b and in which crystal defect lines 20adq and 20bdq are newly generated, eliminated, branched or merged at interfaces 20i between single-crystal diamond layers 20a and 20b, and crystal defect points 20adp on a crystal growth principal surface 20am and crystal defect points 20bdp on a crystal growth principal surface 20bm opposite to crystal growth principal surface 20am are denser than crystal defect points at interfaces 20i between single-crystal diamond layers 20a and 20b as shown in FIG. 10.

Figure 11:
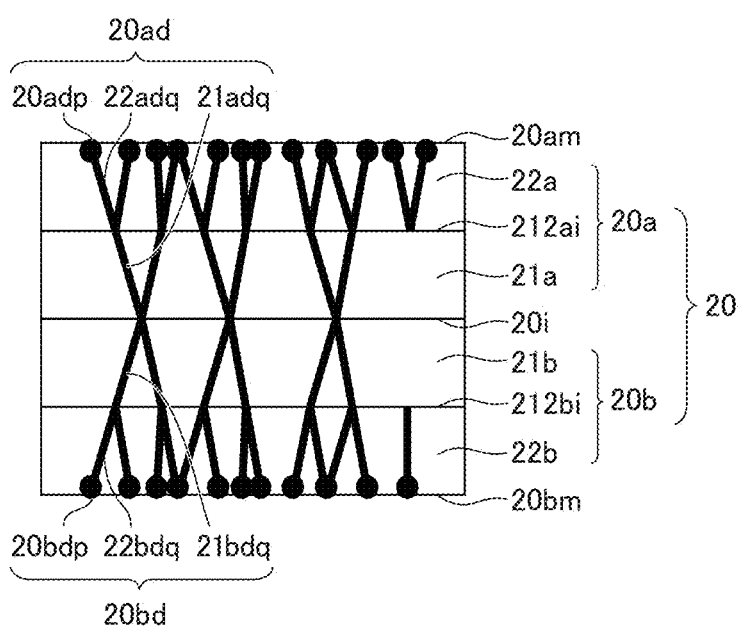
FIG. 11 is a schematic sectional diagram showing still another example of a cross-section perpendicular to a crystal growth principal surface of a single-crystal diamond according to one aspect of the present invention.

In addition, referring to FIGS. 9(D) and 11, the step of adding and growing single-crystal diamond 20 can be carried out by growing an additional single-crystal diamond by a CVD method on principal surface 20n opposite to crystal growth principal surface 20m of single-crystal diamond 20 obtained as in FIG. 9(D). In this manner, single-crystal diamond 20 can be obtained which includes a plurality of single-crystal diamond layers 21a, 21b, 22a and 22b and in which crystal defect lines 21adq, 21bdq, 22adq and 22bdq are newly generated, eliminated, branched or merged at interfaces 20i, 212ai and 212bi between single-crystal diamond layers 21a, 21b, 22a and 22b, and crystal defect points 20adp on crystal growth principal surface 20am and crystal defect points 20bdp on crystal growth principal surface 20bm opposite to crystal growth principal surface 20am are denser than crystal defect points at interfaces 20i, 212ai and 212bi between single-crystal diamond layers 21a, 21b, 22a and 22b as shown in FIG. 11.

Embodiment 2: Single-Crystal Diamond

A single-crystal diamond according to this embodiment will be described with reference to FIGS. 1 to 13.

An example of single-crystal diamond 20 of this embodiment contains nitrogen as an impurity element in an amount of less than 500 ppb. Since single-crystal diamond 20 of this example contains nitrogen atoms as impurity element atoms only in an amount of less than 500 ppb, single-crystal diamond 20 has a low concentration of nitrogen atoms as heterogeneous element atoms that disturb extension of chipping in application of strong stress to a specific portion, and therefore, large chipping over a long distance easily occurs, but since a large number of crystal defect lines 20dq, 21dq and 22dq themselves, and relaxation of stress by the crystal defect lines disturb extension of chipping, occurrence of large chipping is suppressed. In addition, since the content of nitrogen atoms in single-crystal diamond 20 of this example is less than 500 ppb, single-crystal diamond 20 has a high light transmittance even when the number of crystal defects increases. Thus, the single-crystal diamond of this example is suitably used for applications of semiconductor materials (diodes, transistors and the like), electronic components (resistive parts, capacitive parts and the like), heat dissipation materials (heat sinks), optical components (window materials, lenses and the like), ornament materials, cutting tools, polishing tools and the like.

The content of nitrogen in single-crystal diamond 20 is less than 500 ppb, preferably less than 250 ppb, more preferably less than 75 ppb, still more preferably less than 35 ppb, especially preferably less than 15 ppb. The content of nitrogen in single-crystal diamond 20 is measured by a SIMS (secondary ion mass spectrometry) method. When the content of nitrogen is less than or equal to about 10 ppb, i.e. a lower detection limit in the SIMS method, the content is difficult to measure, and is therefore measured by an EPR (electron spin paramagnetic resonance) method. The lower detection limit in the EPR method is 0.01 ppb.

The content of nitrogen in single-crystal diamond 20 is adjusted by a volume ratio of a combination of a carbon-containing gas and an oxygen-containing gas in gases to be introduced into a chamber, a protective film ratio (%) defined by a percentage ratio of the area of protective film 5 to the area of an exposed surface of auxiliary plate 4, or the like. From the viewpoint of reducing the content of nitrogen in single-crystal diamond 20, the volume ratio of $CH_4:O_2:H_2$ in a combination of gases is preferably 1:0.01:20 to 1:0.4:100, more preferably 1:0.03:20 to 1:0.4:100, and the protective film ratio is preferably greater than or equal to 30%, more preferably greater than or equal to 50%, still more preferably greater than or equal to 80%, especially preferably greater than or equal to 90%, most preferably 100%.

Another example of single-crystal diamond 20 of this embodiment contains silicon as an impurity element in an amount of less than 1000 ppb. Since single-crystal diamond 20 of this example contains silicon atoms as impurity element atoms only in an amount of less than 1000 ppb, single-crystal diamond 20 has a low concentration of silicon atoms as heterogeneous element atoms that disturb extension of chipping in application of strong stress to a specific portion, and therefore large chipping over a long distance easily occurs, but since a large number of crystal defect lines 20*dq*, 21*dq* and 22*dq* themselves, and relaxation of stress by the crystal defect lines disturb extension of chipping, occurrence of large chipping is suppressed. In addition, since the content of silicon atoms in single-crystal diamond 20 of this example is less than 1000 ppb, single-crystal diamond 20 has a high light transmittance even when the number of crystal defects increases. Thus, the single-crystal diamond of this example is suitably used for applications of semiconductor materials (diodes, transistors and the like), electronic components (resistive parts, capacitive parts and the like), heat dissipation materials (heat sinks), optical components (window materials, lenses and the like), ornament materials, cutting tools, polishing tools and the like.

The content of silicon in single-crystal diamond 20 is less than 1000 ppb, preferably less than 200 ppb, more preferably less than 50 ppb, still more preferably less than 5 ppb, especially preferably less than 0.05 ppb, most preferably less than 0.005 ppb. The content of silicon in single-crystal diamond 20 is measured by a SIMS method. When the content of silicon is less than or equal to about 1 ppb, i.e. a lower detection limit in the SIMS method, the content is difficult to measure, and is therefore measured by a low-temperature PL (photoluminescence) spectroscopic method. In low-temperature PL spectroscopy measurement, a sample is entirely cooled by liquid nitrogen, and green (514 nm) laser excitation is performed. A peak at 572 nm resulting from diamond and a peak at 737 nm resulting from silicon are observed in low-temperature PL spectroscopic measurement, and from a correlation between the intensity ratio of these peaks (737 nm/572 nm) and the quantitative value in the SIMS method, a silicon content of less than or equal to 1 ppb is measured. The lower detection limit in the low-temperature PL spectroscopic method is 0.0001 ppb.

The content of silicon in single-crystal diamond 20 is adjusted by a volume ratio of a combination of a carbon-containing gas and an oxygen-containing gas to gases to be introduced into a chamber, a protective film ratio (%) defined by a percentage ratio of the area of protective film 5 to the area of an exposed surface of auxiliary plate 4, or the like. From the viewpoint of reducing the content of silicon in single-crystal diamond 20, the volume ratio of $CH_4:O_2:H_2$ in a combination of gases is preferably 1:0.01:20 to 1:0.8:100, more preferably 1:0.05:20 to 1:0.8:100, and the protective film ratio is preferably greater than or equal to 30%, more preferably greater than or equal to 50%, still more preferably greater than or equal to 80%, especially preferably greater than or equal to 90%, most preferably 100%.

Still another example of single-crystal diamond 20 according to this embodiment contains impurity elements other than nitrogen and silicon in an amount of less than 500 ppb. Since single-crystal diamond 20 of this example contains impurity element atoms other than nitrogen atoms and silicon atoms only in an amount of less than 500 ppb, single-crystal diamond 20 has a low concentration of impurity element atoms other than nitrogen atoms and silicon atoms, which are heterogeneous element atoms that disturb extension of chipping in application of strong stress to a specific portion, and therefore large chipping over a long distance easily occurs, but since a large number of crystal defect lines 20*dq*, 21*bdq* and 22*dq* themselves, and relaxation of stress by the crystal defect lines disturb extension of chipping, occurrence of large chipping is suppressed. In addition, since the content of impurity atoms other than nitrogen atoms and silicon atoms in single-crystal diamond 20 of this example is less than 500 ppb, single-crystal diamond 20 has a high light transmittance even when the number of crystal defects increases. Thus, the single-crystal diamond of this example is suitably used for applications of semiconductor materials (diodes, transistors and the like), electronic components (resistive parts, capacitive parts and the like), heat dissipation materials (heat sinks), optical components (window materials, lenses and the like), ornament materials, cutting tools, polishing tools and the like.

The content of impurity elements other than nitrogen and silicon in the single-crystal diamond is less than 500 ppb, preferably less than 200 ppb, more preferably less than 100 ppb, still more preferably less than 75 ppb. The content of impurity elements other than nitrogen and silicon in the single-crystal diamond is measured by a SIMS method. When the content of impurity elements other than nitrogen and silicon is less than or equal to about 0.5 ppb, i.e. a lower detection limit in the SIMS method, the content is difficult to measure.

Here, impurity elements (atoms) other than nitrogen (atoms) and silicon (atoms) are elements (atoms) contained in auxiliary plate 4 and protective film 5 of auxiliary plate 8 with a protective film which is used in the method for manufacturing single-crystal diamond 20 according to the embodiment, and specific examples thereof include oxygen, magnesium, aluminum, titanium, chromium, nickel, copper, strontium, yttrium, zirconium, molybdenum, hafnium, tungsten and iridium.

In single-crystal diamond 20 of this embodiment, the transmittance of light having a wavelength of 500 nm may be greater than or equal to 55% when the single-crystal diamond has a thickness of 500 μm. Here, the light transmittance when the single-crystal diamond has a thickness of 500 μm is a light transmittance measured when the single-crystal diamond has a thickness of 500 μm, or a light transmittance determined by measuring a light transmittance when the thickness of the single-crystal diamond is not 500 μm, and converting the measured light transmittance to a value when the single-crystal diamond has a thickness of 500 μm. In addition, for correctly evaluating the light transmittance, it is preferable to polish the surface so that the surface scattering ratio is less than or equal to 2%. A conventional single-crystal diamond absorbs light having a wavelength of 500 nm due to a synergistic effect of crystal defects and impurity atoms, so that the transmittance of light having such a wavelength decreases. However, since single-crystal diamond 20 of this embodiment has a high purity, occurrence of large chipping is suppressed while the transmittance of light having a wavelength of 500 nm is greater than or equal to 55% when the thickness is 500 μm. Here, when the surface scattering occurs, the light transmittance in single-crystal diamond 20 of this embodiment means a regular transmittance with conversion performed for correcting surface scattering. The regular transmittance can be calculated from the measured transmittance in accordance with the conversion expression: (regular transmittance)= (measured transmittance)/(1−((surface scattering ratio)/ 100). For example, when the surface scattering ratio is 2%, a value obtained by dividing the measured transmittance by 0.98 can be defined as a regular transmittance.

In single-crystal diamond 20 of this embodiment, it is preferable that groups of crystal defect points 20dp that are tip points at which crystal defect lines 20dq indicating lines having crystal defects 20d in an X-ray topographic image for crystal growth principal surface 20m reach crystal growth principal surface 20m aggregate. In addition, in single-crystal diamond 20 of this embodiment, it is preferable that a plurality of crystal defect linear aggregation regions 20r, where groups of crystal defect points 20dp that are tip points at which crystal defect lines 20dq indicating lines having crystal defects 20d in an X-ray topographic image for crystal growth principal surface 20m reach crystal growth principal surface 20m aggregate and extend linearly in a direction at an angle less than or equal to 30° with respect to one arbitrarily specified direction, are present in parallel. FIG. 5 schematically shows an X-ray topographic image taken in a transmission mode, where crystal defect points 20dp that are tip points at which crystal defect lines 20dq reach crystal growth principal surface 20m are shown as black circle points so that crystal defect points 20dp can be easily identified.

An Ib type single-crystal diamond which is widely used for cutting tools and abrasion-proof tools and which is grown by a high-temperature and high-pressure method contains a nitrogen impurity in isolated substitution type, and nitrogen atoms of isolated substitution type serve as origination points of plastic deformation to prevent occurrence of large chipping. However, in a single-crystal diamond grown by a CVD method (CVD single-crystal diamond), nitrogen atoms of isolated substitution type hardly exist, and nitrogen atoms exist in the form of agglomerations with voids or a plurality of nitrogen atoms, which rather cause occurrence of large chipping.

The present inventors have found that when a large number of dispersed crystal defects 20d are positively introduced into the CVD single-crystal diamond in such a manner that a plurality of crystal defect linear aggregation regions 20r, where groups of crystal defect points 20dp aggregate and extend linearly in a direction at an angle less than or equal to 30° with respect to one arbitrarily specified direction, are arranged in parallel, stress is relaxed, and therefore fine abrasions are promoted, so that large chipping making the single-crystal diamond unusable as a cutting tool hardly occurs. In addition, the present inventors have found that in a Ib type single-crystal diamond grown by a high-temperature and high-pressure method, it is difficult to introduce dispersed dislocations as in a CVD single-crystal diamond, a large number of dislocations are diffused radially from seed crystals, so that there is no anisotropy, or low crystal defect bundles are easily formed, chipping resistance is not improved, and thus improvement of chipping resistance by introduction of dislocations is unique to a CVD single-crystal diamond.

In single-crystal diamond 20, a plurality of crystal defect linear aggregation regions 20r, where groups of crystal defect points 20dp that are tip points at which crystal defect lines 20dq reach the crystal growth principal surface 20m aggregate and extend linearly in a direction at an angle less than or equal to 30° with respect to one arbitrarily specified direction, are present in parallel, so that stress is relaxed by a large number of crystal defect lines 20dq to suppress occurrence of large chipping, and a direction in which chipping hardly occurs can be controlled by a plurality of crystal defect linear aggregation regions 20r which are present in parallel, and extend linearly in a direction at an angle less than or equal to 30° with respect to one arbitrarily specified direction. Therefore, the single-crystal diamond is suitably used for cutting tools, polishing tools, optical components, electronic components, semiconductor materials and the like.

Here, the one arbitrarily specified direction is an average direction in which groups of crystal defect lines aggregate and extend linearly, and the one arbitrarily specified direction may be, for example, the <110> direction in which abrasion resistance is high in the case of a cutting tool, or the <100> direction in which abrasion is easy when consideration is given to productivity in a polishing step, and the direction can be selected according to a use purpose and a use method. It has been found that the directions in which groups of crystal defect lines aggregate and extend linearly may be dispersed to some extent, but when θ shown in FIG. 6 is less than or equal to 30°, chipping resistance is more effectively improved.

In single-crystal diamond 20 of this embodiment, the presence of crystal defect points 20dp and crystal defect lines 20dq is shown in an X-ray topographic image of crystal growth principal surface 20m. That is, crystal defect points 20dp and crystal defect lines 20dq have a higher X-ray reflection intensity as compared to other portions of the crystal (portions having a smaller number of defects, i.e. portions having higher crystallinity), and therefore the presence thereof is shown as a dark spot in the case of a positive image, and as a light spot in the case of a negative image in an X-ray topographic image.

Here, crystal defects 20d include various kinds of defects such as point defects, dislocations, chipping, cracks and crystal strains. In addition, dislocations include edge dislocations, helical dislocations, and complex dislocations obtained by combining any of a plurality of edge dislocations and a plurality of helical dislocations. Crystal defect lines 20dq including crystal defects 20d are newly generated, or the lines are stopped when reaching crystal growth principal surface 20m. The tip of the crystal defect line 20dq, which reaches the crystal growth principal surface 20m, is called crystal defect point 20dp. In the present invention, the density is defined by counting the number of crystal defect points 20dp per unit area. Since it is practically impossible to count $1 \times 10^4$ or more crystal defect points as in the present invention, an average value for five positions in an arbitrary region with a limited area may be employed. The number of crystal defect points is counted with the area limited such that a region of 1 mm square is selected when the number of crystal defect points is greater than or equal to $10/mm^2$, a region of 500 μm square is selected when the number of crystal defect points is greater than or equal to $100/mm^2$, and a region of 100 μm square is selected when the number of crystal defect points is greater than or equal to $1 \times 10^4/mm^2$, and the counted number of crystal defect points is converted to a value in $mm^{-2}$. Here, the region where crystal defect points is counted is necessarily a portion including a crystal defect line aggregation region. If which side of the part where the crystal defect line is stopped reaches the crystal growth principal surface is not known, the incidence angle and the diffraction surface in a transmission type X-ray topographic image are changed, or a photograph is also taken in reflection type X-ray topography to reveal crystal defect points.

Crystal defect points 20*dp* that are tip points of crystal defect lines 20*dq* that are lines having crystal defects 20*d* aggregate linearly on crystal growth principal surface 20*m* to form crystal defect linear aggregation region 20*r*. Thus, crystal defect linear aggregation region 20*r* is favorably shown in an X-ray topographic image measured in a transmission mode in a direction parallel to a crystal growth direction of single-crystal diamond 20 (i.e. direction perpendicular to crystal growth principal surface 20*m*). The X-ray topographic image can also be measured in a reflection mode, but an X-ray topographic image measured in a reflection mode is an image of overlapping crystal defect lines 20*dq*, and therefore it is difficult to clarify the aggregated state of crystal defect points 20*dp*. For measurement of such crystal defects, mention is made of a method utilizing birefringence (birefringence method), but there may be dislocations that do not appear in a birefringence image, or conversely, point defects that are not structural defects may appear in a birefringence image, and therefore X-ray topography is more favorable than a birefringence method.

In measurement of an X-ray topographic image of the single-crystal diamond of this embodiment, it is necessary to observe dense crystal defect points, and therefore use of an X-ray of emitted light is preferable. In the case of measurement in a transmission mode, for example, measurement is performed with (220) diffraction of 2θ=32.9° using an X-ray having a wavelength of 0.71 Å. In the case of measurement in a reflection mode, for example, measurement may be performed with (113) diffraction of 2θ=52.4° using an X-ray having a wavelength of 0.96 Å. When crystal defect points are not clear as described above, the crystal defect points are specified by taking a photograph while changing the wavelength and the diffraction angle. Similarly, measurement may be performed using a laboratory type X-ray diffractometer. For example, (111) diffraction may be observed with a Mo ray source, and (113) diffraction may be observed with a Cu ray source, but a long measurement time is required for taking a photograph at a high resolution. It is also possible to use a CCD camera for measurement, but it is preferable to use a nuclear plate for improving the resolution. Preferably, a nuclear plate is stored, developed and fixed in a cooling environment at 10° C. or lower for avoiding an increase in noise. After development, an image is captured with an optical microscope, and crystal defect points and crystal defect lines are quantified.

The crystal growth direction of single-crystal diamond 20 corresponds to an average direction of directions of a plurality of crystal defect lines 20*dq*. In addition, crystal growth principal surface 20*m* of the single-crystal diamond refers to the outermost crystal growth principal surface, which is generally perpendicular to the crystal growth direction.

For the direction in which crystalline defect linear aggregation region 20*r* extends linearly, one arbitrarily specified direction as a reference is preferably be the <100> direction, and is preferably a direction at an angle less than or equal to 30°, more preferably a direction at an angle less than or equal to 15° with respect to the <100> direction. Since the single-crystal diamond is easily cleaved in the <111> direction, and therefore when the direction in which crystal defect linear aggregation region 20*r* extends linearly is a direction as described above, chipping in single-crystal diamond 20 can be further suppressed. In addition, since the diamond seed crystal substrate 10 that is used in growth of single-crystal diamond 20 by a CVD method is often a Ib type single-crystal grown by a high-temperature and high-pressure method, single-crystal diamond 20 with the principal surface being parallel to the <100> direction is easily obtained, and thus it is easy to obtain a tool having a large blade width, an optical component having a large area, an electronic component having a large area, a semiconductor material having a large area or the like. Depending on a type of tool or the like to be used, alignment in the <110> direction in which abrasion resistance is high, and here, the <110> direction is a direction in which crystal defect linear aggregation region 20*r* extends linearly.

In the method for manufacturing single-crystal diamond 20 according to this embodiment, it is preferable that two or more crystal defect linear aggregation regions 20*r* are present per 1 mm in a direction perpendicular to a direction in which the crystal defect linear aggregation regions extend linearly (average direction of a plurality of directions in which a plurality of crystal defect linear aggregation regions extend, respectively, i.e. one specified direction as described above), and the distance D between the crystal defect linear aggregation regions is less than or equal to 500 μm in the direction in which the regions extend linearly. In single-crystal diamond 20, two or more crystal defect linear aggregation regions 20*r* are present per 1 mm in a direction perpendicular to a direction in which the crystal defect linear aggregation regions extend linearly, and the distance between the crystal defect linear aggregation regions is less than or equal to 500 μm in the direction in which the regions extend linearly. Thus, stress is relaxed by a large number of crystal defect lines 20*dq* to suppress occurrence of large chipping, and a direction in which chipping hardly occurs can be controlled by a plurality of dense crystal defect linear aggregation regions 20*r* which are present in parallel, and extend linearly in a direction at an angle less than or equal to 30° with respect to one arbitrarily specified direction.

From the above-mentioned viewpoint, it is more preferable that four or more crystal defect linear aggregation regions 20*r* are present per 1 mm in a direction perpendicular to a direction in which the crystal defect linear aggregation regions linearly extend, and/or distance D between the crystal defect linear aggregation regions is less than or equal to 100 μm in the direction in which the regions extend linearly. A pitch P between a plurality of crystal linear aggregation regions 20*r* is preferably less than or equal to 500 μm, and more preferably less than or equal to 250 μm.

In single-crystal diamond 20 of this embodiment, it is preferable that five or more long crystal defect linear aggregation regions 20*r* having a length L greater than or equal to 300 μm as shown in FIG. 6 are present per 1 cm$^2$ of crystal growth principal surface 20*m*. In single-crystal diamond 20, occurrence of chipping in single-crystal diamond 20 is suppressed, and the strength of single-crystal diamond 20 as a whole is increased because five or more long crystal defect linear aggregation regions having a length greater than or equal to 300 μm are present per 1 cm$^2$ of crystal growth principal surface 20*m*. From such a viewpoint, it is more preferable that twenty or more longer crystal defect linear aggregation regions 20*r* having a length L greater than or equal to 500 μm as shown in FIG. 6 are present per 1 cm$^2$ of the principal surface. In quantification of the number of crystal defect linear aggregation regions per 1 mm (number·mm$^{-1}$), the distance (μm) between crystal defect linear aggregation regions in a direction in which the crystal defect linear aggregation regions extend linearly, the number of long crystalline defect linear aggregation regions having a length of greater than or equal to 300 μm (number·cm$^{-2}$) and the number of longer crystalline defect linear aggregation regions having a length of greater than or equal to 500 µm (number·cm$^{-2}$), a region of at least 1 mm square (1 mm×1 mm) is observed.

In single-crystal diamond 20 of this embodiment, the density of crystal defect points 20$dp$ is preferably greater than 20 mm$^{-2}$, more preferably greater than 300 mm$^{-2}$, still more preferably greater than 1000 mm$^{-2}$, especially preferably greater than 1×10$^4$ mm$^{-2}$. In single-crystal diamond 20, occurrence of large chipping is suppressed due to relaxation of stress by dense crystal defect lines 20$dq$ corresponding to dense crystal defect points 20$dp$ because the density of crystal defect points 20$dp$ is greater than 20 mm$^{-2}$. Further, when the density of crystal defect points 20$dp$ is greater than 1000 mm$^{-2}$, the single-crystal diamond is excellent in chipping resistance even to intermittent cutting with a wiper tip. However, when crystal defect points 20$dp$ are excessively close to one another, rather a stress increasing effect is applied, and therefore the density of crystal defect points 20$dp$ is preferably less than 1×10$^6$ mm$^{-2}$.

In single-crystal diamond 20 of this embodiment, the density of complex dislocation points that are tip points at which complex dislocations obtained by combining any of a plurality of edge dislocations and a plurality of helical dislocations reach crystal growth principal surface 20$m$, among crystal defect points 20$dp$ is preferably greater than 20 mm$^{-2}$, more preferably greater than 30 mm$^{-2}$, still more preferably greater than 300 mm$^{-2}$, especially preferably greater than 3000 mm$^{-2}$. In single-crystal diamond 20, occurrence of large chipping is further suppressed because the density of complex dislocation points that are tip points at which complex dislocations reach crystal growth principal surface 20$m$ is greater than 20 mm$^{-2}$, and the effect of relaxing stress by complex dislocations is high. Further, when the density of complex dislocation points is greater than 300 mm$^{-2}$, the single-crystal diamond is excellent in chipping resistance even to intermittent cutting with a wiper tip. However, when complex dislocation points are excessively close to one another, rather a stress increasing effect is applied, and therefore the density of complex dislocation points is preferably less than 3×10$^5$ mm$^{-2}$.

Here, the complex dislocation can be observed by changing the X-ray diffraction direction (g vector) in X-ray topography. For example, in observation of the (001) plane as crystal growth principal plane 20$m$ of the diamond single crystal in a transmission mode, the dislocation is an edge dislocation when the (001) plane can be observed with a g vector in the [440] direction, but cannot be observed with a g vector in, for example, the [4-40] direction that is orthogonal to the g vector, and the dislocation is a complex dislocation when the (001) plane can be observed with a plurality of mutually orthogonal g vectors in, for example, the [440] direction and the [4-40] direction. In observation of other dislocations having a Burgers vector which is not perpendicular to the <001> direction that is a traveling direction of dislocations as crystal defect lines 20$dq$ and which also has a component in the <001> direction, for example, the dislocations can be observed with g vectors in the [044] direction, the direction, the [111] direction, the [113] direction and the like in a reflection mode. However, in the case of the reflective mode, the image is overlapped by crystal defect lines 20$dq$ of dislocations etc., and therefore it is difficult to determine whether crystal defects form a structure in the present invention.

Referring to FIG. 8, it is preferable that single-crystal diamond 20 of this embodiment includes a plurality of single-crystal diamond layers 21 and 22. Since single-crystal diamond 20 includes a plurality of single-crystal diamond layers 21 and 22, formation of crystal defect lines 21$dq$ and 22$dq$ is accelerated, so that occurrence of large chipping is further suppressed.

In first single-crystal diamond layer 21 grown by a CVD method on principal surface 10$m$ of diamond seed crystal substrate 10 having seed crystal defect linear aggregation regions, where groups of seed crystal defect points 10$dp$ aggregate and extend linearly, on principal surface 10$m$, crystal defect lines 21$dq$ originating from defects at seed crystal defect points 10$dp$ on principal surface 10$m$ extend in a crystal growth direction. In second single-crystal diamond layer 22 grown on first single-crystal diamond layer 21 by a CVD method, tips at which crystal defect lines 22$dq$ originating from defects at crystal defect lines 21$dq$ extend in a crystal growth direction and reach crystal growth principal surface 20$m$ of single-crystal diamond 20 are crystal defect points 20$dp$.

Here, in general, a plurality of crystal defect lines 21$dq$ originate from one seed crystal defect point 10$dp$ of diamond seed crystal substrate 10 in first single-crystal diamond layer 21, and a plurality of crystal defect lines 22$dq$ originate from one crystal defect line 21$dq$ of first single-crystal diamond layer 21 in second single-crystal diamond layer 22. Therefore, as the number of single-crystal diamond layers 21 and 22 increases, the number of crystal defect points 20$dp$ of single-crystal diamond 20 increase.

Figure 7:
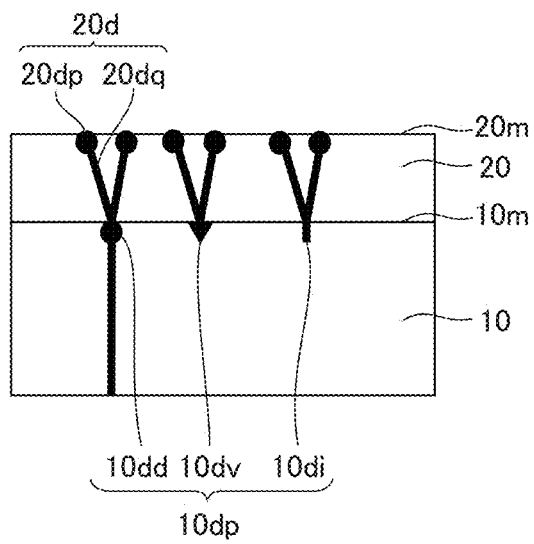
FIG. 7 is a schematic sectional diagram showing an example of a cross-section perpendicular to a crystal growth principal surface of a single-crystal diamond according to one aspect of the present invention.

FIG. 9(C) shows single-crystal diamond 20 obtained by removing diamond seed crystal substrate 10 from single-crystal diamond 20 grown on principal surface 10$m$ of diamond seed crystal substrate 10 as shown in FIG. 7. In addition, FIG. 9(D) shows single-crystal diamond 20 which includes a plurality of single-crystal diamond layers 21 and 22 and which is obtained by removing diamond seed crystal substrate 10 from single-crystal diamond 20 including a plurality of single-crystal diamond layers 21 and 22 grown on principal surface 10$m$ of diamond seed crystal substrate 10 as shown in FIG. 8.

Referring to FIG. 9(D), single-crystal diamond 20 includes a plurality of single-crystal diamond layers 21 and 22, and crystal defect lines 21$dq$ and 22$dq$ are newly generated or branched at interfaces 212$i$ between singly-crystal diamond layers 21 and 22, and crystal defect points 20$dp$ on crystal growth principal surface 20$m$ are denser than crystal defect points 20$ndp$ on a principal surface 20$n$ opposite to crystal growth principal surface 20$m$. In single-crystal diamond 20, crystal defect lines 21$dp$ and 22$dp$ are newly generated or branched at interfaces between single-crystal diamond layers 21 and 22, and thus the number of crystal defect points 20$dp$ at crystal growth principal surface 20$m$ increases each time the number of single-crystal diamond layers 21 and 22 increases, so that crystal defect points 20$dp$ at crystal growth principal surface 20$m$ are denser than crystal defect points 20$ndp$ at principal surface 20$n$ opposite to crystal growth principal surface 20$m$, leading to further improvement of chipping resistance. Newly generated crystal defect lines may be branched and extend as shown in FIG. 9(D).

FIG. 10 shows a single-crystal diamond obtained by growing an additional single-crystal diamond on principal surface 20$n$ opposite to crystal growth principal surface 20$m$ of single-crystal diamond 20 shown in FIG. 9(C). In addition, FIG. 11 shows a single-crystal diamond obtained by growing an additional single-crystal diamond including a plurality of single-crystal diamond layers on principal surface 20$n$ opposite to crystal growth principal surface 20$m$ of single-crystal diamond 20 including a plurality of single-crystal diamond layers 21 and 22 as shown in FIG. 9(D).

Referring to FIGS. 10 and 11, single-crystal diamond 20 of this embodiment includes a plurality of single-crystal diamond layers 20a, 20b, 21a, 21b, 22a and 22b, and crystal defect lines 20adq, 20bdq, 21adq, 21bdq, 22adq and 22bdq are newly generated, eliminated, branched or merged at interfaces 20i, 212ai and 212bi between single-crystal diamond layers 20a, 20b, 21a, 21b, 22a and 22b, and crystal defect points 20adp on crystal growth principal surface 20am and crystal defect points 20bdp on crystal growth principal surface 20bm opposite to crystal growth principal surface 20am are denser than crystal defect points at interfaces 20i, 212ai and 212bi between single-crystal diamond layers 20a, 20b, 21a, 21b, 22a and 22b. In single-crystal diamond 20, crystal defect lines 20adq, 20bdq, 21adq, 21bdq, 22adq and 22bdq are newly generated, eliminated, branched or merged at interfaces 20i, 212al and 212bi between single-crystal diamond layers 20a, 20b, 21a, 21b, 22a and 22b, and thus the number of crystal defect points 20apd at crystal growth principal surface 20am and the number of crystal defect points 20bdp at opposite crystal growth principal surface 20bm increase each time the number of single-crystal diamond layers 20a, 20b, 21a, 21b, 22a and 22b increases, so that crystal defect points 20adp at crystal growth principal surface 20am and crystal defect points 20bdp at opposite crystal growth principal surface 20bm are denser than crystal defect points at interfaces 20i, 212ai and 212bi between single-crystal diamond layers 20a, 20b, 21a, 21b, 22a and 22b. Thus, occurrence of large chipping at the principal surfaces on both sides is suppressed, so that the principal surfaces on both sides have high chipping resistance, leading to improvement of strength. Elimination of crystal defect lines means elimination of some of a plurality of crystal defect lines.

As will be described later, single-crystal diamond 20 shown in FIGS. 10 and 11 is obtained by growing single-crystal diamond layers 20a and 20b from interface 20i between the layers to crystal growth principal surfaces 20am and 20bm. Therefore, crystal defect lines 20adq and 20bdq are newly generated or branched from interface 20i in directions of both crystal growth principal surfaces 20am and 20bm. That is, in a direction from one crystal growth principal surface 20am through interface 20i to other crystal growth principal surface 20bm, crystal defect lines 20adq, 21adq and 22adq are eliminated or merged between one crystal growth surface principal surface 20am and interface 20i, and crystal defect lines 20bdq, 21bdq and 22bdq are newly generated or branched between interface 20i and other crystal growth principal surface 20bm.

When crystal defect lines are newly generated, eliminated, branched or merged at each interface between single-crystal diamond layers as described above, it is difficult to discriminate the positions of crystal defect lines and crystal defect points. When such a structure is discriminated, it is preferable the cross-section of the single-crystal diamond is cut, and measurement is performed. When the cutting direction is set to the <100> direction, and the cross-section is set to the (010) plane, it is easy to make discrimination in measurement, but the cutting direction may be other direction with the cross-section set to, for example, the (110) plane.

Here, in single-crystal diamond 20 shown in FIGS. 9(C) and 9(D), the density of crystal defect points 20dp at crystal growth principal surface 20m increases, and chipping resistance on the crystal growth principal surface 20m side is improved, but chipping resistance on the principal surface 20n side opposite to crystal growth principal surface 20m is not improved. On the other hand, in single-crystal diamond 20 shown in FIGS. 10 and 11, the density of crystal defect points 20adp at crystal growth principal surface 20am and crystal defect points 20bdp at opposite crystal growth principal surface 20bm increases, and therefore chipping resistance on both principal surface sides is improved. In addition, as compared to a single-crystal diamond in which crystal defect lines are uniformly distributed in the thickness direction, a single-crystal diamond including a plurality of single-crystal diamond layers 21, 21a, 21b, 22, 22a and 22b with these single-crystal diamond layers including layers having a small number of crystal defect lines 21dq, 21adq, 21bdq, 22dq, 22adq and 22bdq and layers having a large number of crystal defect lines 21dq, 21adq, 21bdq, 22dq, 22adq and 22bdq has higher chipping resistance at the same crystal defect density. In the case of, for example, a cutting bite, a material in which both a cutting surface and a brazed surface are strong enough to inhibit chipping, slipping-out of brazing and the like can be obtained from a single-crystal diamond having a nonuniform distribution of crystal defect lines in the thickness direction as described above.

Embodiment 3: CVD (Chemical Vapor Deposition) Device

The CVD device according to this embodiment will be described with reference to FIGS. 2 and 3.

A CVD device 1 of this embodiment is CVD device 1 to be used in the method for manufacturing single-crystal diamond 20 according to embodiment 1, the device including chamber 2, and auxiliary plate 8 with a protective film, which is disposed in chamber 2 and in which protective film 5 is formed on at least a part of a surface of auxiliary plate 4. CVD device 1 of this embodiment includes auxiliary plate 8 with a protective film, which is disposed in chamber 2, and thus CVD device 1 is capable of manufacturing single-crystal diamond 20 of embodiment 2.

In CVD device 1 of this embodiment, for example, substrate support member 3 is provided in chamber 2. Normally, chamber 2 is formed of a quartz tube, and substrate support member 3 is formed of copper. A substrate holder 6 is disposed on the upper surface of substrate support member 3. Diamond seed crystal substrate 10 is disposed on the upper surface of substrate holder 6. Diamond seed crystal substrate 10 is disposed so as to expose a principal surface thereof. Auxiliary plate 8 with a protective film in which protective film 5 is formed on auxiliary plate 4 is disposed on the upper surface of substrate support member 3. Auxiliary plate 8 with a protective film is disposed so as to expose at least a part of protective film 5. Preferably, substrate holder 6 and auxiliary plate 8 with a protective film are disposed so as to cover the entire upper surface of substrate support member 3.

EXAMPLES

Example I (Samples I-1 to I-6)
1. Preparation of Diamond Seed Crystal Substrate Having Seed Crystal Defect Linear Aggregation Regions on Principal Surface Referring to FIG. 9(A), a diamond seed crystal substrate of 5 mm×5 mm×1 mm (thickness) grown by a high-temperature and high-pressure method was prepared as diamond seed crystal substrate 10. In the diamond seed crystal substrate, principal surface 10m had an off angle of 2° to 10° in the <100> direction with respect to the (001) plane.

For samples I-1 to I-5, polishing scratches extending linearly in the <100> direction were formed as seed crystal defect linear aggregation regions on principal surface 10m of each diamond seed crystal substrate 10 under the condition of a rotation speed of 500 rpm to 3000 rpm, a load of 0.5 kgf to 5 kgf and a polishing time of 30 minutes to 60 minutes using a whetstone obtained by fixing diamond grains having an average grain size of 9 µm to 35 µm with a metal. For a sample I-6, principal surface 10m of diamond seed crystal substrate 10 was polished under the condition of a rotation speed of 50 rpm, a load of 0.1 kgf and a polishing time of 600 minutes using a whetstone obtained by fixing diamond grains having an average grain size of 5 µm with a metal, so that there were almost no polishing scratches extending linearly in the <100> direction as seed crystal defect linear aggregation regions. For samples I-4 and I-6, principal surface 10m of diamond seed crystal substrate 10 was then subjected to dry etching with an oxygen ($O_2$) gas and a hydrogen tetrafluoride ($CF_4$) gas to adjust the density of seed crystal defect points 10dp and seed crystal damage points 10di.

For principal surface 10m of each diamond seed crystal substrate 10 on which seed crystal defect linear aggregation regions were formed, the linear density (number·mm$^{-1}$) of seed crystal defect linear aggregation regions in a direction perpendicular to a direction in which the regions extended linearly, the maximum distance (µm) between seed crystal defect linear aggregation regions in a direction in which the regions extended linearly, the density (number·cm$^{-2}$) of seed crystal defect linear aggregation regions having a length greater than or equal to 300 µm, the density (number·cm$^{-2}$) of seed crystal defect linear aggregation regions having a length greater than or equal to 500 µm, and the density (mm$^{-2}$) of seed crystal defect points were then calculated from an X-ray topographic image measured in a direction perpendicular to principal surface 10m in a transmission mode. Further, by irradiating principal surface 10m of diamond seed crystal substrate 10 with a hydrogen plasma generated by introduction of a microwave, principal surface 10m of each diamond seed crystal substrate 10 on which seed crystal defect linear aggregation regions were formed was hydrogen-terminated, and the density (mm$^{-2}$) of seed crystal damage points 10di was calculated from a secondary electron image in which carriers excited by primary electrons in an electron microscope were detected as secondary electrons. The results are summarized in Table 1. In Table 1, the term "groups are linear" means that groups of crystal defect points aggregate and extend linearly, and the term "scattered" means that crystal defect points are scattered. In addition, the term "HPHT" means that the substrate is a single-crystal substrate prepared by a high-temperature and high-pressure method.

Conductive layer region 10c was then formed by ion-implanting carbon in a dose amount of $1\times10^{15}$ number·cm$^{-2}$ to $1\times10^{18}$ number·cm$^{-2}$ with an energy of 300 keV to 3 MeV on the principal surface 10m side of diamond seed crystal substrate 10 in each of samples I-1 to I-6, on which seed crystal defect linear aggregation regions were formed.

2. Growth of Single-Crystal Diamond

Next, referring to FIG. 9(B), single-crystal diamond 20 was grown by a microwave plasma CVD method on principal surface 10m of each diamond seed crystal substrate 10 on which seed crystal defect linear aggregation regions were formed. A quartz plate was used as an auxiliary plate to be disposed in a chamber of the microwave plasma CVD device, and an auxiliary plate with a protective film was obtained in which a protective film was formed on a principal surface and lateral surfaces of the quartz plate by a vacuum sputtering method. The type of the protective film, the protective film ratio, and the distance between the auxiliary plate with the protective film and the substrate are shown in Table 1.

Next, as shown in FIG. 3, diamond seed crystal substrate 10 was disposed in substrate holder 6 in chamber 2 of CVD device 1, and auxiliary plate 8 with the protective film was disposed on substrate support member 3.

Using a hydrogen gas, a methane gas and an oxygen gas as crystal growing gases for a single-crystal diamond, a single-crystal diamond was grown at a crystal growth pressure of 25 kPa and a crystal growth temperature (diamond seed crystal substrate temperature of 1000° C. by a microwave plasma CVD method. The volume ratio blending ratios of the gases here are shown in Table 1.

3. Removal of Diamond Seed Crystal Substrate

Next, referring to FIG. 9(C), diamond seed crystal substrate 10 was removed from single-crystal diamond 20 in each of samples I-1 to I-6 by decomposing and removing conductive layer region 10c in diamond seed crystal substrate 10 by electrolytic etching.

For crystal growth principal surface 20m as the (001) plane of each single-crystal diamond 20 thus obtained, the linear density (number·mm$^{-1}$) of crystal defect linear aggregation regions in a direction perpendicular to a direction in which the regions extended linearly, the maximum distance (µm) between crystal defect linear aggregation regions in a direction in which the regions extended linearly, the density (number·cm$^{-2}$) of crystal defect linear aggregation regions having a length greater than or equal to 300 µm, the density (number·cm$^{-2}$) of crystal defect linear aggregation regions having a length greater than or equal to 500 the density (mm$^{-2}$) of crystal defect points, and the density (mm$^{-2}$) of complex dislocation points were then calculated from an X-ray topographic image measured in a direction perpendicular to principal surface 20m in a transmission mode. Here, the X-ray diffraction surface was set to the (220) plane. The energy of the X-ray used was 14.547 keV (wavelength: 0.85 Å). The results are summarized in Table 1.

4. Addition and Growth of Single-Crystal Diamond

Next, referring to FIG. 9(D), single-crystal diamond 20 was further added and grown for samples I-2, I-3 and I-5. The crystal growth conditions in the addition and growth were the same as the conditions for the above-described initial crystal growth. Thus-obtained single-crystal diamond 20 in each of samples I-2, I-3 and I-5 had three single-crystal diamond layers.

5. Evaluation of Physical Properties of Single-Crystal Diamond

For crystal growth principal surface 20m as the (001) plane of each single-crystal diamond 20 thus obtained, the linear density (number·mm$^{-1}$) of crystal defect linear aggregation regions in a direction perpendicular to a direction in which the regions extended linearly, the maximum distance (µm) between crystal defect linear aggregation regions in a direction in which the regions extended linearly, the density (number·cm$^{-2}$) of crystal defect linear aggregation regions having a length greater than or equal to 300 µm, the density (number·cm$^{-2}$) of crystal defect linear aggregation regions having a length greater than or equal to 500 µm, the density (mm$^{-2}$) of crystal defect points, and the density (mm$^{-2}$) of complex dislocation points were then calculated from an X-ray topographic image measured in a direction perpendicular to principal surface 20m in a transmission mode. Here, the X-ray diffraction surface was set to the (220)

plane. The energy of the X-ray used was 14.547 keV (wavelength: 0.85 Å). The results are summarized in Table 1.

(Measurement of Single-Crystal Diamond)

The contents of nitrogen, silicon, and impurity elements other than nitrogen and silicon in single-crystal diamond 20 were measured by a SIMS method. When the content was less than or equal to a lower detection limit in the SIMS method, the content of nitrogen was measured using an EPR method in combination, and the content of silicon was measured using a low-temperature PL spectroscopic method in combination.

(Measurement of Light Transmittance)

A 500 μm-thick sample was formed from the obtained single-crystal diamond, and the transmittance of light having a wavelength of greater than or equal to 410 nm and less than or equal to 750 nm was measured by scanning the sample with a spectrophotometer at a wavelength ranging from 410 nm to 750 nm. Thus, the light transmittance at a wavelength of 500 nm was determined. When the surface scattering occurs, the light transmittance in the single-crystal diamond of this example means a regular transmittance with conversion performed for correcting surface scattering. The regular transmittance is calculated from the measured transmittance in accordance with the conversion expression: (regular transmittance)=(measured transmittance)/(1−((surface scattering ratio)/100). Here, the surface scattering ratio is a value obtained by determining the measured transmittance and the measured conversion reflectance, and subtracting the measured transmittance and the measured conversion reflectance from 1. That is, the surface scattering ratio is determined from the expression: (surface scattering rate)=1−(measured transmittance)−(measured conversion reflectance). The measured transmittance is a transmittance measured at an incidence angle of 0° (perpendicular incidence) with respect to a surface of the sample. The measured conversion reflectance is a reflectance obtained in the following manner: the reflectance of light incident at an incidence angle of 10° with respect to a surface of the sample is converted to a reflectance in perpendicular reflection with an incidence angle of 0° and a reflection angle of 0° using a measured reflectance measured at a reflection angle of −10°. This conversion conforms to a general optical theoretical formula. The measured reflectance is measured with non-polarized light, and is therefore almost equal to the measured conversion reflectance.

Here, a light transmittance T refers to a percentage ratio of an intensity $I_1$ of transmitted light to an intensity $I_0$ of incident light, and is defined by the following expression:

$T(\%) = I_1/I_0 \times 100$.

Strictly speaking, this light transmittance takes a reflectance and multiple reflection at parallel principal surfaces (parallelization degree is less than or equal to 0.1%) into consideration, and is expressed as a total transmittance T ($T = T_1^2 \cdot \exp(-\alpha D)/(1-R_1^2 \cdot \exp(-\alpha D))$) using a reflectance $R_1$ and a transmittance $T_1$ of the interface between air and the single-crystal diamond. Here, a is an absorption coefficient (unit: $cm^{-1}$), and D is a distance (unit: $cm^{-1}$) between the parallel principal surfaces.

Reflectance $R_1$ and transmittance $T_1$ are expressed by:

$R_1 = (n_0-n_1)^2/(n_0+n_1)^2$ $T_1 = 4n_0 n_1/(n_0+n_1)^2$ where $n_1$ is a refractive index of the single-crystal diamond, and $n_0$ is a refractive index of air. These expressions show that when the single-crystal diamond has a refractive index of 2.4, and is transparent (a is approximately 0), the transmittance is about 71%, and therefore a result consistent with the measured value is obtained.

(Evaluation of Chipping Resistance)

Chipping resistance was evaluated from the obtained single-crystal diamond in the following manner: an optical window material was laser-cut into a shape having a diameter of 3 mm, an end surface treatment was then performed by polishing the peripheral edge on the front and the back, and the number of chips of greater than or equal to 1 μm, which were generated at this time (chipping number) was determined. A sample having a small chipping number has high chipping resistance.

TABLE 1

| | Sample | | I-1 | I-2 | I-3 | I-4 | I-5 | I-6 |
|---|---|---|---|---|---|---|---|---|
| Diamond seed crystal substrate | Method for manufacturing seed crystal substrate | | HPHT | HPHT | HPHT | HPHT | HPHT | HPHT |
| | State of seed crystal defect points | | Scattered | Scattered | Scattered | Scattered | Scattered | Scattered |
| | Seed crystal defect linear aggregation region | Linear density (number · $mm^{-1}$) | 5 | 4 | 4 | 2 | 4 | 0 |
| | | Maximum distance (μm) | 250 | 230 | 210 | 185 | 235 | — |
| | | Density of lines having length greater than or equal to 300 μm (number · $cm^{-2}$) | 180 | 210 | 200 | 42 | 205 | 0 |
| | | Density of lines having length greater than or equal to 500 μm (number · $cm^{-2}$) | 85 | 100 | 95 | 10 | 95 | 0 |
| | Density of seed crystal defect points ($mm^{-2}$) | | 280 | 350 | 350 | 11 | 330 | 1.1 |
| | Density of seed crystal damage points ($mm^{-2}$) | | 100 | 120 | 120 | 6 | 115 | 0.2 |
| Crystal growth conditions | Auxiliary plate | | Quartz | Quartz | Quartz | Quartz | Quartz | Quartz |
| | Protective film | | Al | Hf | Al | Ti | — | — |
| | Protective film ratio (%) | | 100 | 100 | 30 | 100 | — | — |
| | Distance between auxiliary plate with protective film and substrate (mm) | | 30 | 30 | 30 | 30 | — | — |
| | Gas volume ratio ($CH_4:O_2:H_2$) | | 1:0.1:20 | 1:0.1:20 | 1:0.1:20 | 1:0.1:20 | 1:0.1:20 | 1:0.1:20 |

TABLE 1-continued

| | Sample | | I-1 | I-2 | I-3 | I-4 | I-5 | I-6 |
|---|---|---|---|---|---|---|---|---|
| Single-crystal diamond | State of crystal defect points | | Group is linear | Group is linear | Group is linear | Group is linear | Group is linear | Scattered |
| | Crystal defect linear aggregation region | Linear density (number · mm$^{-1}$) | 5 | 4 | 4 | 2 | 4 | 0 |
| | | Maximum distance (μm) | 250 | 230 | 210 | 185 | 235 | — |
| | | Density of lines having length greater than or equal to 300 μm (number · cm$^{-2}$) | 180 | 210 | 200 | 42 | 205 | 0 |
| | | Density of lines having length greater than or equal to 500 μm (number · cm$^{-2}$) | 85 | 100 | 95 | 10 | 95 | 0 |
| | Density of crystal defect points (mm$^{-2}$) | | 1700 | 4300 | 4100 | 23 | 4100 | 2.1 |
| | Density of complex dislocation points (mm$^{-2}$) | | 800 | 1800 | 1670 | 21 | 1700 | 0.9 |
| | Number of single crystal diamond layers | | 1 | 3 | 3 | 1 | 3 | 1 |
| | Thickness of single-crystal diamond (μm) | | 500 | 500 | 500 | 500 | 500 | 500 |
| | Concentration of nitrogen atoms (ppb) | | 0.12 | 0.11 | 400 | 0.11 | 645 | 630 |
| | Concentration of silicon atoms (ppb) | | 0.001 | 0.0011 | 900 | 0.0012 | 1380 | 1355 |
| | Concentration of element atoms other than nitrogen and silicon (type: ppb) | | Al: 40 | <0.5 | Al: 45 | Ti: 10 | <0.5 | <0.5 |
| | Transmittance (%) of light having wavelength of 500 nm | | 64 | 61 | 56 | 65 | 38 | 46 |
| Chipping resistance | Chipping number | | 0 | 0 | 0 | 0 | 0 | 6 |

For samples I-1 to I-4 prepared using the auxiliary plate with the protective film, the light transmittance defined as described above was greater than or equal to 55%. In addition, for samples I-1 to I-5 prepared using the diamond seed crystal substrate having seed crystal defect linear aggregation regions, the chipping number defined as described above was 0. That is, it was found that for samples I-1 to I-4 prepared using both the auxiliary plate with the protective film and the diamond seed crystal substrate having seed crystal defect linear aggregation regions, the light transmittance defined as described above was as high as greater than or equal to 55%, and the chipping resistance defined as described above was high with the chipping number being 0. It was considered that the single-crystal diamond obtained in this example had a very high purity, and was hardly chipped due to the effect of controlling crystal defects.

Example II (Samples II-1 to II-8)
1. Preparation of Diamond Seed Crystal Substrate for Obtaining Diamond Crystal Substrate in which Groups of Crystal Defect Points Aggregate on Principal Surface Referring to FIG. 9(A), as the diamond seed crystal substrate 10, a diamond seed crystal substrate of 5 mm×5 mm×1 mm in thickness grown by the high-temperature high-pressure method and the CVD method and having the principal surface 10m with an off angle of 2° to 10° in the <100> direction from the (001) was prepared.

For samples II-1 to II-6, seed crystal damage points were formed on principal surface 10m of each diamond seed crystal substrate 10 under the condition of a rotation speed of 500 rpm to 3000 rpm, a load of 0.2 kgf to 2 kgf and a polishing time of 100 minutes to 150 minutes using a whetstone obtained by fixing diamond grains having an average grain size of 9 μm to 35 μm with a metal. For a sample II-7, principal surface 10m of diamond seed crystal substrate 10 was polished under the condition of a rotation speed of 50 rpm, a load of 0.1 kgf and a polishing time of 600 minutes using a whetstone obtained by fixing diamond grains having an average grain size of 5 μm with a metal, so that there were almost no polishing scratches as seed crystal defect linear aggregation regions. Sample II-8 was not evaluated as a seed substrate to be epitaxially grown, but evaluated with the sample subjected to normal polishing for optical properties as a reference. For samples II-1 to II-3 and II-8, principal surface 10m of diamond seed crystal substrate 10 was then subjected to dry etching with an oxygen ($O_2$) gas and a hydrogen tetrafluoride ($CF_4$) gas to adjust the density of seed crystal defect points 10dp and seed crystal damage points 10di.

For principal surface 10m of each diamond seed crystal substrate 10, the linear density (number·mm$^{-1}$) of seed crystal defect linear aggregation regions in a direction perpendicular to a direction in which the regions extended linearly, the maximum distance (μm) between seed crystal defect linear aggregation regions in a direction in which the regions extended linearly, the density (number·cm$^{-2}$) of seed crystal defect linear aggregation regions having a length greater than or equal to 300 μm, the density (number·cm$^{-2}$) of seed crystal defect linear aggregation regions having a length greater than or equal to 500 μm, and the density (mm$^{-2}$) of seed crystal defect points were then calculated from an X-ray topographic image measured in a direction perpendicular to principal surface 10m in a transmission mode. Further, by irradiating principal surface 10m of diamond seed crystal substrate 10 with a hydrogen plasma generated by introduction of a microwave, principal surface 10m of each diamond seed crystal substrate 10 was hydrogen-terminated, and the density (mm$^{-2}$) of seed crystal damage points 10di was calculated from a secondary electron image in which carriers excited by primary electrons in an electron microscope were detected as secondary electrons. The results are summarized in Table 2. In Table 2, the term "groups aggregate" means that crystal defect points aggregate, the term "group linear" means that groups of crystal defect points aggregate and extend linearly, the term "scattered" means that crystal defect points are scattered. The term "HPHT" means that the substrate is a single-crystal substrate prepared by a high-temperature and high-pressure method, and the term "CVD" means that the substrate is a single-crystal substrate prepared by a chemical vapor deposition method. Sample II-8 was not evaluated as one grown on a seed substrate, but evaluated with the seed crystal substrate itself considered as a single-crystal diamond.

Conductive layer region 10c was then formed by ion-implanting carbon in a dose amount of $1\times10^{15}$ number·cm$^{-2}$ to $1\times10^{18}$ number·cm$^{-2}$ with an energy of 300 keV to 3 MeV on the principal surface 10m side of diamond seed crystal substrate 10 in each of samples II-1 to II-7.

2. Growth of Single-Crystal Diamond

Next, referring to FIG. 9(B), single-crystal diamond 20 was grown by a microwave plasma CVD method on principal surface 10m of diamond seed crystal substrate 10 in each of samples II-1 to II-7, on which seed crystal defect linear aggregation regions were formed. A quartz plate was used as an auxiliary plate to be disposed in a chamber of the microwave plasma CVD device, and an auxiliary plate with a protective film was obtained in which a protective film was formed on a principal surface and lateral surfaces of the quartz plate by a vacuum sputtering method. The type of the protective film, the protective film ratio, and the distance between the auxiliary plate with the protective film and the substrate are shown in Table 2.

Next, as shown in FIG. 3, diamond seed crystal substrate 10 was disposed in substrate holder 6 in chamber 2 of CVD device 1, and auxiliary plate 8 with the protective film was disposed on substrate support member 3.

Using a hydrogen gas, a methane gas and an oxygen gas as crystal growing gases for a single-crystal diamond, a single-crystal diamond was grown at a crystal growth pressure of 25 kPa and a crystal growth temperature (diamond seed crystal substrate temperature of 1000° C. by a microwave plasma CVD method. The volume ratio blending ratios of the gases here are shown in Table 2.

3. Removal of Diamond Seed Crystal

Next, referring to FIG. 9(C), diamond seed crystal substrate 10 was removed from single-crystal diamond 20 in each of samples II-1 to II-7 by decomposing and removing conductive layer region 10c in diamond seed crystal substrate 10 by electrolytic etching.

For crystal growth principal surface 20m as the (001) plane of each single-crystal diamond 20 thus obtained, the linear density (number·mm$^{-1}$) of crystal defect linear aggregation regions in a direction perpendicular to a direction in which the regions extended linearly, the maximum distance (μm) between crystal defect linear aggregation regions in a direction in which the regions extended linearly, the density (number·cm$^{-2}$) of crystal defect linear aggregation regions having a length greater than or equal to 300 μm, the density (number·cm$^{-2}$) of crystal defect linear aggregation regions having a length greater than or equal to 500 μm, the density (mm$^{-2}$) of crystal defect points, and the density (mm$^{-2}$) of complex dislocation points were then calculated from an X-ray topographic image measured in a direction perpendicular to principal surface 20m in a transmission mode. Here, the X-ray diffraction surface was set to the (220) plane. The energy of the X-ray used was 14.547 keV (wavelength: 0.85 Å). The results are summarized in Table 2.

4. Addition and Growth of Single-Crystal Diamond

Next, referring to FIG. 9(D), single-crystal diamond 20 was further added and grown for samples II-3 and II-6. The crystal growth conditions in the addition and growth were the same as the conditions for the above-described initial crystal growth. Thus-obtained single-crystal diamond 20 in each of samples II-3 and II-6 had three single-crystal diamond layers.

5. Evaluation of Physical Properties of Single-Crystal Diamond

For crystal growth principal surface 20m as the (001) plane of each single-crystal diamond 20 thus obtained, the linear density (number·mm$^{-1}$) of crystal defect linear aggregation regions in a direction perpendicular to a direction in which the regions extended linearly, the maximum distance (μm) between crystal defect linear aggregation regions in a direction in which the regions extended linearly, the density (number·cm$^{-2}$) of crystal defect linear aggregation regions having a length greater than or equal to 300 μm, the density (number·cm$^{-2}$) of crystal defect linear aggregation regions having a length greater than or equal to 500 μm, the density (mm$^{-2}$) of crystal defect points, and the density (mm$^{-2}$) of complex dislocation points were then calculated from an X-ray topographic image measured in a direction perpendicular to principal surface 20m in a transmission mode. Here, the X-ray diffraction surface was set to the (220) plane. The energy of the X-ray used was 14.547 keV (wavelength: 0.85 Å). The results are summarized in Table 2.

(Measurement of Single-Crystal Diamond)

The contents of nitrogen, silicon, and impurity elements other than nitrogen and silicon in single-crystal diamond 20 were measured by a SIMS method. The method was the same as in Example 1.

(Measurement of Light Transmittance)

The transmittance of light at a wavelength of 500 nm was determined by the same method as in Example 1. The expression and the meaning of the light transmittance were also the same as in Example 1.

(Evaluation of Chipping Resistance)

Evaluation was performed by the same method as in Example 1. That is, a sample having a small chipping number has high chipping resistance.

TABLE 2

| | Sample | | II-1 | II-2 | II-3 | II-4 |
|---|---|---|---|---|---|---|
| Diamond seed crystal substrate | Method for manufacturing seed crystal substrate | | HPHT Scattered | HPHT Scattered | HPHT Scattered | CVD Groups aggregate |
| | State of seed crystal defect points | | | | | |
| | Seed crystal defect linear aggregation region | Linear density (number · mm$^{-1}$) | 0 | 0 | 0 | 0 |
| | | Maximum distance (μm) | — | — | — | — |
| | | Density of lines having length greater than or equal to 300 μm (number · cm$^{-2}$) | 0 | 0 | 0 | 0 |
| | | Density of lines having length greater than or equal to 500 μm (number · cm$^{-2}$) | 0 | 0 | 0 | 0 |
| | Density of seed crystal defect points (mm$^{-2}$) | | 12 | 54 | 180 | 670 |
| | Density of seed crystal damage points (mm$^{-2}$) | | 6 | 12 | 60 | 320 |
| Crystal growth conditions | Auxiliary plate | | Quartz | Quartz | Quartz | Sapphire |
| | Protective film | | Hf | Zr | Ti | Ti |
| | Protective film ratio (%) | | 100 | 100 | 100 | 100 |
| | Distance between auxiliary plate with protective film and substrate (mm) | | 30 | 30 | 30 | 30 |
| | Gas volume ratio (CH$_4$:O$_2$:H$_2$) | | 1:0.1:20 | 1:0.1:20 | 1:0.1:20 | 1:0.1:20 |

TABLE 2-continued

| Single-crystal diamond | State of crystal defect points | | | Groups aggregate | Groups aggregate | Groups aggregate | Groups aggregate |
|---|---|---|---|---|---|---|---|
| | Crystal defect linear aggregation region | Linear density (number · mm⁻¹) | | 0 | 0 | 0 | 0 |
| | | Maximum distance (μm) | | — | — | — | — |
| | | Density of lines having length greater than or equal to 300 μm (number · cm⁻²) | | 0 | 0 | 0 | 0 |
| | | Density of lines having length greater than or equal to 500 μm (number · cm⁻²) | | 0 | 0 | 0 | 0 |
| | Density of crystal defect points (mm⁻²) | | | 48 | 310 | 1200 | 1800 |
| | Density of complex dislocation points (mm⁻²) | | | 23 | 90 | 180 | 550 |
| | Number of single crystal diamond layers | | | 1 | 1 | 3 | 1 |
| | Thickness of single-crystal diamond (μm) | | | 500 | 500 | 500 | 500 |
| | Concentration of nitrogen atoms (ppb) | | | 2 | 8 | 17 | 30 |
| | Concentration of silicon atoms (ppb) | | | 0.003 | 0.01 | 0.6 | 4 |
| | Concentration of element atoms other than nitrogen and silicon (type: ppb) | | | Hf: 3 | Zr: 15 | Ti: 80 | Ti: 150 |
| | Transmittance (%) of light having wavelength of 500 nm | | | 69 | 68 | 64 | 62 |
| Chipping resistance | | Chipping number | | 0 | 0 | 0 | 0 |

| | Sample | | | II-5 | II-6 | II-7 | II-8 |
|---|---|---|---|---|---|---|---|
| Diamond seed crystal substrate | Method for manufacturing seed crystal substrate | | | CVD | CVD | HPHT | HPHT |
| | State of seed crystal defect points | | | Group is linear | Group is linear | Scattered | None |
| | Seed crystal defect linear aggregation region | Linear density (number · mm⁻¹) | | 6 | 8 | 0 | — |
| | | Maximum distance (μm) | | 210 | 150 | — | — |
| | | Density of lines having length greater than or equal to 300 μm (number · cm⁻²) | | 120 | 670 | 0 | — |
| | | Density of lines having length greater than or equal to 500 μm (number · cm⁻²) | | 60 | 320 | 0 | — |
| | Density of seed crystal defect points (mm⁻²) | | | 230 | 1600 | 9 | — |
| | Density of seed crystal damage points (mm⁻²) | | | 120 | 250 | 3 | — |
| Crystal growth conditions | Auxiliary plate | | | Sapphire | Sapphire | Quartz | — |
| | Protective film | | | Zr | Al | — | — |
| | Protective film ratio (%) | | | 50 | 100 | — | — |
| | Distance between auxiliary plate with protective film and substrate (mm) | | | 30 | 30 | — | — |
| | Gas volume ratio (CH₄:O₂:H₂) | | | 1:0.1:20 | 1:0.1:20 | 1:0.1:20 | — |
| Single-crystal diamond | State of crystal defect points | | | Group is linear | Group is linear | Scattered | None |
| | Crystal defect linear aggregation region | Linear density (number · mm⁻¹) | | 6 | 11 | 0 | 0 |
| | | Maximum distance (μm) | | 170 | 110 | — | — |
| | | Density of lines having length greater than or equal to 300 μm (number · cm⁻²) | | 160 | 960 | 0 | — |
| | | Density of lines having length greater than or equal to 500 μm (number · cm⁻²) | | 90 | 620 | 0 | — |
| | Density of crystal defect points (mm⁻²) | | | 3600 | 12000 | 19 | 0 |
| | Density of complex dislocation points (mm⁻²) | | | 1600 | 4000 | 8 | 0 |
| | Number of single crystal diamond layers | | | 1 | 3 | 1 | 1 |
| | Thickness of single-crystal diamond (μm) | | | 500 | 500 | 500 | 500 |
| | Concentration of nitrogen atoms (ppb) | | | 70 | 240 | 520 | <10 |
| | Concentration of silicon atoms (ppb) | | | 40 | 190 | 1050 | <0.001 |
| | Concentration of element atoms other than nitrogen and silicon (type: ppb) | | | Zr: 180 | Al: 300 | <0.5 | <0.5 |
| | Transmittance (%) of light having wavelength of 500 nm | | | 58 | 57 | 43 | 71 |
| Chipping resistance | | Chipping number | | 0 | 0 | 5 | 10 |

For samples II-1 to II-6 prepared using the auxiliary plate with the protective film, the light transmittance was greater than or equal to 55%. In addition, for samples II-1 to II-6 prepared using the diamond seed crystal substrate having seed crystal defect linear aggregation regions, the chipping number was 0. That is, it was found that for samples II-1 to II-6 prepared using both the auxiliary plate with the protective film and the diamond seed crystal substrate having seed crystal defect linear aggregation regions, the light transmittance was as high as greater than or equal to 55%, and the chipping resistance was high with the chipping number being 0. It was considered that the single-crystal diamond obtained in this example had a very high purity, and was hardly chipped due to the effect of controlling crystal defects.

On the other hand, sample II-8 was a cautiously prepared single-crystal diamond having no defects, a high purity and an almost ideal transmittance of 71%, but sample II-8 was easily chipped.

The embodiments disclosed herein should be construed to be illustrative in all respects, and nonrestrictive. The scope of the present invention is given by claims rather than the above-described embodiments, and intended to include meanings equivalent to claims, and all changes within the scope of claims.

REFERENCE SIGNS LIST

1: CVD device, 2: Chamber, 3: Substrate support member, 4: Auxiliary plate, 5: Protective film, 6: Substrate holder, 8: Auxiliary plate with protective film, 10: Diamond seed crystal substrate, 10c: Conductive layer region, 10dp: Seed crystal defect point, 10dd: Seed crystal dislocation point, 10di: Seed crystal damage point, 10dv: Seed crystal chipping point, 10m, 20n: Principal surface, 20: Single-crystal diamond, 20d, 20ad , 20bd: Crystal defect, 20dp, 20adp, 20bdp, 20ndp: Crystal defect point, 20dq, 20adq, 20bdq, 21dq, 21adq, 21bdq, 22dq, 22adq, 22bdq: Crystal defect line, 20i, 212i, 212ai, 212bi: Interface, 20m, 20am, 20bm: Crystal growth principal surface, 20r: Crystal defect linear aggregation region, 20a, 20b, 21, 21a, 21b, 22, 22a, 22b:

Single-crystal diamond layer, S1: Step of forming protective film on auxiliary plate, S2: Step of preparing diamond seed crystal substrate, S3: Step of disposing auxiliary plate with protective film and diamond seed crystal substrate in chamber, S4: Step of growing single-crystal diamond on principal surface of diamond seed crystal substrate

The invention claimed is:

1. A single-crystal diamond comprising nitrogen as an impurity element in an amount of less than 500 ppb, silicon as an impurity element in an amount of less than 1000 ppb, and impurity elements other than nitrogen and silicon in an amount of less than 500 ppb, wherein
groups of crystal defect points that are tip points at which crystal defect lines indicating lines having crystal defects in an X-ray topographic image for a crystal growth principal surface reach the crystal growth principal surface aggregate.

2. The single-crystal diamond according to claim 1, wherein a transmittance of light having a wavelength of 500 nm is greater than or equal to 55% and less than 71% when the single-crystal diamond has a thickness of 500 μm.

3. The single-crystal diamond according to claim 1, wherein a plurality of crystal defect linear aggregation regions, where the groups of crystal defect points extend linearly in a direction at an angle less than or equal to 30° with respect to one arbitrarily specified direction, are present in parallel.

4. The single-crystal diamond according to claim 3, wherein two or more crystal defect linear aggregation regions are present per 1 mm in a direction perpendicular to a direction in which the crystal defect linear aggregation regions extend linearly, and a distance between the crystal defect linear aggregation regions is less than or equal to 500 μm in the direction in which the regions extend linearly.

5. The single-crystal diamond according to claim 3, wherein five or more long crystal defect linear aggregation regions having a length greater than or equal to 300 μm are present per 1 cm$^2$ of the crystal growth principal surface.

6. The single-crystal diamond according to claim 1, wherein a density of the crystal defect points is greater than 20 mm$^{-2}$.

7. The single-crystal diamond according to claim 1, wherein a density of complex dislocation points that are tip points at which complex dislocations obtained by combining any of a plurality of edge dislocations and a plurality of helical dislocations reach the crystal growth principal surface, among the crystal defect points is greater than 20 mm$^{-2}$.

8. The single-crystal diamond according to claim 1, which comprises a plurality of single-crystal diamond layers.

9. The single-crystal diamond according to claim 8, wherein the crystal defect lines are newly generated or branched at interfaces between the single-crystal diamond layers, and the crystal defect points at the crystal growth principal surface are denser than the crystal defect points at a principal surface opposite to the crystal growth principal surface.

10. The single-crystal diamond according to claim 8, wherein the crystal defect lines are newly generated, eliminated, branched or merged at interfaces between the single-crystal diamond layers, and the crystal defect points at the crystal growth principal surface and the crystal defect points at a crystal growth principal surface opposite to the crystal growth principal surface are denser than the crystal defect points at interfaces between the single-crystal diamond layers.

* * * * *